US011131473B2

(12) United States Patent
Risbeck et al.

(10) Patent No.: US 11,131,473 B2
(45) Date of Patent: Sep. 28, 2021

(54) HVAC SYSTEM DESIGN AND OPERATIONAL TOOL FOR BUILDING INFECTION CONTROL

(71) Applicant: Johnson Controls Technology Company, Auburn Hills, MI (US)

(72) Inventors: Michael J. Risbeck, Madison, WI (US); Kirk H. Drees, Cedarburg, WI (US); Jonathan D. Douglas, Mequon, WI (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 0 days.

(21) Appl. No.: 16/927,766

(22) Filed: Jul. 13, 2020

(65) Prior Publication Data

US 2020/0348038 A1 Nov. 5, 2020

Related U.S. Application Data

(60) Provisional application No. 62/873,631, filed on Jul. 12, 2019, provisional application No. 63/044,906, filed on Jun. 26, 2020.

(51) Int. Cl.
| | |
|---|---|
| *F24F 11/47* | (2018.01) |
| *F24F 11/52* | (2018.01) |
| *F24F 8/10* | (2021.01) |
| *G06F 30/20* | (2020.01) |
| *G05B 15/02* | (2006.01) |

(Continued)

(52) U.S. Cl.
CPC ............... *F24F 11/47* (2018.01); *F24F 8/10* (2021.01); *F24F 11/52* (2018.01); *F24F 11/64* (2018.01);

(Continued)

(58) Field of Classification Search
None
See application file for complete search history.

(56) References Cited

U.S. PATENT DOCUMENTS

| | | |
|---|---|---|
| 6,988,671 B2 | 1/2006 | Deluca |
| 7,025,281 B2 | 4/2006 | Deluca |

(Continued)

FOREIGN PATENT DOCUMENTS

| | | | |
|---|---|---|---|
| CN | 101387428 A | * 3/2009 | ............. F24F 3/044 |
| CN | 107477782 A | 12/2017 | |

(Continued)

OTHER PUBLICATIONS

P. Azimi and B. Stephens, "HVAC filtration for controlling infectious airborne disease transmission in indoor environments: Predicting risk reductions and operational costs", May 13, 2013, Building and Environment. (Year: 2013).*

(Continued)

*Primary Examiner* — Mohammad Ali
*Assistant Examiner* — Kelvin Booker
(74) *Attorney, Agent, or Firm* — Foley & Lardner LLP

(57) ABSTRACT

A heating, ventilation, or air conditioning system (HVAC) design and operational tool includes one or more processors and memory storing instructions that, when executed by the one or more processors, cause the one or more processors to perform operations including obtaining a dynamic temperature model and a dynamic infectious quanta model for one or more building zones, determining an infection probability, and performing a plurality of simulations for a plurality of different equipment configurations using the dynamic temperature model, the dynamic infectious quanta model, and the infection probability to generate results. The operations include generating, using the results of the plurality of simulations, at least one of design including one or more recommended design parameters data or operational data including one or more recommended operational parameters for the HVAC system and initiating an automated action using at least one of the design data or the operational data.

21 Claims, 10 Drawing Sheets

(51) Int. Cl.
| | | |
|---|---|---|
| *G05B 19/04* | (2006.01) | |
| *F24F 11/64* | (2018.01) | |
| F24F 140/60 | (2018.01) | |
| F24F 110/10 | (2018.01) | |
| F24F 110/20 | (2018.01) | |
| F24F 120/20 | (2018.01) | |
| F24F 8/22 | (2021.01) | |

(52) U.S. Cl.
CPC ............ *F24F 8/22* (2021.01); *F24F 2110/10* (2018.01); *F24F 2110/20* (2018.01); *F24F 2120/20* (2018.01); *F24F 2140/60* (2018.01); *G05B 15/02* (2013.01); *G05B 19/04* (2013.01); *G06F 30/20* (2020.01)

(56) References Cited

U.S. PATENT DOCUMENTS

| | | | |
|---|---|---|---|
| 7,099,895 B2 | 8/2006 | Dempsey | |
| 7,150,408 B2 | 12/2006 | Deluca | |
| 7,222,494 B2 | 5/2007 | Peterson et al. | |
| 7,311,752 B2* | 12/2007 | Tepper | A61L 9/16 |
| | | | 210/500.1 |
| 7,394,370 B2 | 7/2008 | Chan | |
| 7,817,046 B2 | 10/2010 | Coveley et al. | |
| 7,941,096 B2 | 5/2011 | Perkins et al. | |
| 8,049,614 B2 | 11/2011 | Kahn et al. | |
| 8,405,503 B2 | 3/2013 | Wong | |
| 8,862,448 B2* | 10/2014 | Holmes | G16H 50/20 |
| | | | 703/6 |
| 8,867,993 B1 | 10/2014 | Perkins et al. | |
| 8,984,464 B1* | 3/2015 | Mihal | G06F 30/392 |
| | | | 716/122 |
| 9,075,909 B2 | 7/2015 | Almogy et al. | |
| 9,465,392 B2 | 10/2016 | Bradley et al. | |
| 9,618,224 B2 | 4/2017 | Emmons et al. | |
| 9,741,233 B2 | 8/2017 | Laufer et al. | |
| 9,810,441 B2 | 11/2017 | Dean-Hendricks et al. | |
| 9,915,438 B2 | 3/2018 | Cheatham et al. | |
| 10,068,116 B2 | 9/2018 | Good et al. | |
| 10,198,779 B2 | 2/2019 | Pittman et al. | |
| 10,251,610 B2 | 4/2019 | Parthasarathy et al. | |
| 10,359,748 B2 | 7/2019 | Elbsat et al. | |
| 10,528,020 B2* | 1/2020 | Drees | G05B 19/0428 |
| 10,706,375 B2 | 7/2020 | Wenzel et al. | |
| 2007/0101688 A1 | 5/2007 | Wootton et al. | |
| 2007/0202798 A1* | 8/2007 | Billiotte | F24F 7/007 |
| | | | 454/264 |
| 2007/0219645 A1* | 9/2007 | Thomas | G05B 15/02 |
| | | | 700/29 |
| 2008/0206767 A1 | 8/2008 | Kreiswirth et al. | |
| 2009/0078120 A1* | 3/2009 | Kummer | B01D 46/42 |
| | | | 96/222 |
| 2009/0117798 A1* | 5/2009 | Takashima | B01D 39/1615 |
| | | | 442/166 |
| 2009/0126382 A1 | 5/2009 | Rubino et al. | |
| 2010/0047115 A1* | 2/2010 | Krichtafovitch | A61L 9/16 |
| | | | 422/4 |
| 2010/0175556 A1* | 7/2010 | Kummer | B01D 46/52 |
| | | | 95/273 |
| 2010/0198611 A1 | 8/2010 | Ruoff et al. | |
| 2011/0093249 A1 | 4/2011 | Holmes et al. | |
| 2011/0172981 A1* | 7/2011 | Al-Hashimi | G01R 33/465 |
| | | | 703/11 |
| 2012/0112883 A1 | 5/2012 | Wallace et al. | |
| 2012/0130547 A1* | 5/2012 | Fadell | G05D 23/1917 |
| | | | 700/276 |
| 2012/0199003 A1* | 8/2012 | Melikov | A61L 9/20 |
| | | | 95/273 |
| 2014/0167917 A2 | 6/2014 | Wallace et al. | |
| 2014/0260692 A1 | 9/2014 | Sharp | |
| 2014/0283682 A1 | 9/2014 | Hamann et al. | |
| 2015/0028114 A1 | 1/2015 | Rosen | |
| 2015/0053366 A1* | 2/2015 | Melsheimer | E04H 14/00 |
| | | | 165/10 |
| 2015/0097688 A1 | 4/2015 | Bruck et al. | |
| 2015/0109442 A1 | 4/2015 | Derenne et al. | |
| 2015/0316907 A1 | 11/2015 | Elbsat et al. | |
| 2015/0354874 A1 | 12/2015 | Cur et al. | |
| 2016/0066068 A1 | 3/2016 | Schultz et al. | |
| 2016/0109149 A1 | 4/2016 | Heller | |
| 2016/0116181 A1 | 4/2016 | Aultman et al. | |
| 2016/0210337 A1 | 7/2016 | Constandt | |
| 2016/0306934 A1 | 10/2016 | Sperry et al. | |
| 2016/0377306 A1* | 12/2016 | Drees | F24F 11/58 |
| | | | 700/295 |
| 2017/0016644 A1 | 1/2017 | Nagarathinam et al. | |
| 2017/0039339 A1 | 2/2017 | Bitran et al. | |
| 2017/0097163 A1 | 4/2017 | Law et al. | |
| 2017/0123440 A1 | 5/2017 | Mangsuli et al. | |
| 2017/0147722 A1* | 5/2017 | Greenwood | G06F 30/20 |
| 2017/0193792 A1 | 7/2017 | Bermudez Rodriguez et al. | |
| 2017/0206334 A1 | 7/2017 | Huang | |
| 2017/0211837 A1 | 7/2017 | Gupta et al. | |
| 2017/0246331 A1 | 8/2017 | Lloyd | |
| 2017/0350611 A1 | 12/2017 | Su et al. | |
| 2017/0351832 A1 | 12/2017 | Cahan et al. | |
| 2018/0052970 A1 | 2/2018 | Boss et al. | |
| 2018/0087791 A1 | 3/2018 | Monkkonen et al. | |
| 2018/0110416 A1* | 4/2018 | Masuda | A61B 5/015 |
| 2018/0117209 A1* | 5/2018 | Clack | H05H 1/48 |
| 2018/0204162 A1 | 7/2018 | Endel et al. | |
| 2018/0285800 A1 | 10/2018 | Wenzel et al. | |
| 2018/0318746 A1 | 11/2018 | Thomas | |
| 2018/0357577 A1 | 12/2018 | Elbsat et al. | |
| 2019/0096233 A1 | 3/2019 | Bruck et al. | |
| 2019/0108746 A1 | 4/2019 | Chang et al. | |
| 2019/0209806 A1* | 7/2019 | Allen | G05B 15/02 |
| 2019/0219293 A1* | 7/2019 | Wenzel | G06Q 30/0283 |
| 2019/0249897 A1* | 8/2019 | Alcala Perez | F24F 11/62 |
| 2019/0331358 A1 | 10/2019 | Ritmanich et al. | |
| 2019/0347622 A1 | 11/2019 | Elbsat et al. | |
| 2020/0090089 A1 | 3/2020 | Aston et al. | |
| 2020/0125045 A1* | 4/2020 | Risbeck | F24F 11/54 |
| 2020/0141734 A1 | 5/2020 | Casarez et al. | |
| 2020/0176124 A1 | 6/2020 | Chatterjea et al. | |
| 2020/0176125 A1 | 6/2020 | Chatterjea et al. | |
| 2020/0227159 A1 | 7/2020 | Boisvert et al. | |
| 2020/0348038 A1 | 11/2020 | Risbeck et al. | |
| 2021/0011443 A1* | 1/2021 | McNamara | F24F 11/39 |
| 2021/0011444 A1* | 1/2021 | Risbeck | F24F 8/10 |
| 2021/0043330 A1 | 2/2021 | Ikeshima | |

FOREIGN PATENT DOCUMENTS

| | | | |
|---|---|---|---|
| CN | 108980988 A | 12/2018 | |
| CN | 109405151 A | 3/2019 | |
| CN | 110529988 A | 12/2019 | |
| CN | 110671798 A | 1/2020 | |
| CN | 110822616 A | 2/2020 | |
| FR | 3031800 A1 | 7/2016 | |
| JP | 2010-128976 A | 6/2010 | |
| JP | 2012533720 A * | 12/2012 | ............... F24F 7/00 |
| JP | 2015-152175 A | 8/2015 | |
| JP | 2016-138705 A | 8/2016 | |
| JP | 06-455326 B2 | 1/2019 | |
| KR | 20160137767 A | 12/2016 | |
| KR | 20170115913 A | 10/2017 | |
| KR | 101865143 B1 | 6/2018 | |
| KR | 20200047457 A | 5/2020 | |
| WO | WO-2016/047103 A1 | 3/2016 | |
| WO | WO-2017/203031 A1 | 11/2017 | |
| WO | WO-2019/051893 A1 | 3/2019 | |
| WO | WO-2019/157514 A2 | 8/2019 | |

OTHER PUBLICATIONS

Y.H. Joe, K.Y. Yoon and J. Hwang, "Methodology for Modeling the Microbial Contamination of Air Filters", Oct. 3, 2013, PLoS One 9(2). (Year: 2013).*

(56) References Cited

OTHER PUBLICATIONS

M. Kanaan, N. Ghaddar, K. Ghali, and G. Araj, "New airborne pathogen transport model for upper-room UVGI spaces conditioned by chilled ceiling and mixed displacement ventilation: Enhancing air quality and energy performance", Apr. 12, 2014, Energy Conversion and Management 85 (2014) 50-61. (Year: 2014).*
C.-M. Liao, C.-F. Chang and H.-M. Liang, "A Probabilistic Transmission Dynamic Model to Assess Indoor Airborne Infection Risks", Risk Analysis, vol. 25, No. 5, 2005. (Year: 2005).*
C. J. Noakes, C. B. Beggs, P.A. Sleigh and K. G. Kerr, "Modelling the transmission of airborne infections in enclosed spaces", Epidemiol. Infect. (2006), 134, 1082-1091 (Year: 2006).*
Dr. Brent Stephens, "HVAC filtration and the Wells-Riley approach to assessing risks of infectious airborne diseases", Mar. 1, 2012, The National Air Filtration Association (NAFA) Foundation. (Year: 2012).*
Brent Stephens, "HVAC filtration and the Wells-Riley approach to assessing risks of infectious airborne diseases", Mar. 2013, Wells-Riley & HVAC Filtration for infectious airborne aerosols NAFA Foundation Report. (Year: 2013).*
Sangeetha Kumar, "A Simulation Framework to Characterize the Effect of Ventilation Control on Airborne Infectious Disease Transmission in Schools", May 2019, Thesis, Graduate School of The University of Texas at Austin. (Year: 2019).*
Yu Ho Ching, "An empirical drag coefficient model for simulating the dispersion and deposition of bioaerosol particles in ventilated environments", Jun. 2016, The Hong Kong Polytechnic University Department of Building Services Engineering. (Year: 2016).*
P. Azimi and B. Stephens,"HVAC filtration for controlling infectious airborne disease transmission in indoor environments: Predicting risk reductions and operational costs", May 2013, Building and Environment 70 (2013) 150-160. (Year: 2013).*
Aliabadi et al., "Preventing Airborne Disease Transmission: Review of Methods for Ventilation Design in Health Care Facilities", Feb. 2011, SAGE-Hindawi Access to Research Advances in Preventive Medicine vol. 2011, Article ID 124064, 21 pages. (Year: 2011).*
Alexa Copeland, "The Impact of Patient Room Design on Airborne Hospital-Acquired Infections (HAI)", May 2016, thesis Kent State University, Degree of Masters of Science in Architecture and Environmental Design. (Year: 2016).*
U.S. Appl. No. 16/703,514, filed Dec. 4, 2019, Johnson Controls Technology Company.
Aghniaey et al., "The Assumption of Equidistance in the Seven-Point Thermal Sensation Scale and a Comparison between Categorical and Continuous Metrics," University of Georgia College of Engineering, Jan. 18, 2019, 4 pages.
Batterman et al., "Review and Extension of CO2-Based Methods to Determine Ventilation Rates with Application to School Classrooms," International Journal of Environmental Research and Public Health, Feb. 4, 22 pages.
Chen et al., "Occupant Feedback Based Model Predictive Control for Thermal Comfort and Energy Optimization: A Chamber Experimental Evaluation," Applied Energy, 2016, 164, pp. 341-351.
Kang et al., "Novel Modeling and Control Strategies for a HVAC System Including Carbon Dioxide Control," Energies, Jun. 2, 2014, 7, pp. 3599-3617.
Lampinen, "Thermodynamics of Humid Air," Sep. 2015, 39 Pages.
Ljung, System Identification: Theory for the User, 1999, 2nd ed., Prentice Hall PTR, Upper Saddle River, 63 pages.
Luo, "Maximizing Thermal Comfort and International Design: Predicting Thermal Comfort in Mixed-mode Office Building in the UK," Loughborough University, Jan. 18, 2019, 4 pages.
Sudhakaran et al., "Temperature, Relative Humidity, and Carbon-Dioxide Modulation in a Near-Zero Energy Efficient Retrofit House," Purdue University, 2016, 11 pages.
Weekly et al., "Modeling and Estimation of the Humans' Effect on the CO2 Dynamics Inside a Conference Room," IEEE Transactions on Control Systems Technology, Sep. 2015, 23.5, 12 pages.
HVAC Filtration and the Wells-Riley Approach to Assessing Risks of Infectious Airborne Diseases, NAFA Foundation Report, Prepared by Dr. Brent Stephens, IIT, Mar. 1, 2012, 47 pages.
International Search Report and Written Opinion for International Application No. PCT/US2020/041792 dated Sep. 30, 2020, 15 pages.
International Search Report and Written Opinion on PCT/US2020/041845, dated Jan. 13, 2021, 20 pages.
International Search Report and Written Opinion on PCT/US2020/041770, dated Nov. 3, 2020, 13 pages.
Noakes et al., "Applying the Wells-Riley equation to the risk of airborne infection in hospital environments: The importance of stochastic and proximity effects," Indoor Air 2008, The 11th Intl Conference on Indoor Air Quality and CI, Aug. 17-22, 2008, Copenhagen, Denmark, 9 pages.
Noakes et al., "Mathematical models for assessing the role of airflow on the risk of airborne infection in hospital wards," Journal of the Royal Society Interface, 2009, 6, S791-S800, 10 pages.
Sze et al., "Review and Comparison Between the Wells-Riley and Dose-Response Approaches to Risk Assessment of Infectious Respiratory Diseases," Indoor Air, 2010, 20, pp. 2-16.

* cited by examiner

HVAC SYSTEM DESIGN AND OPERATIONAL TOOL FOR BUILDING INFECTION CONTROL

CROSS-REFERENCE TO RELATED PATENT APPLICATIONS

This application claims the benefit of and priority to U.S. Provisional Patent Application No. 62/873,631, filed Jul. 12, 2019, and U.S. Provisional Patent Application No. 63/044,906, filed Jun. 26, 2020, the entire disclosures of which are incorporated by reference herein.

BACKGROUND

The present disclosure relates generally to a building system in a building. The present disclosure relates more particularly to maintaining occupant comfort in a building through environmental control.

Maintaining occupant comfort and disinfection in a building requires building equipment (e.g., HVAC equipment) to be operated to change environmental conditions in the building. In some systems, occupants are required to make any desired changes to the environmental conditions themselves if they are not comfortable. When operating building equipment to change specific environmental conditions, other environmental conditions may be affected as a result. Maintaining occupant comfort and disinfection can be expensive if not performed correctly. Thus, systems and methods are needed to maintain occupant comfort and provide sufficient disinfection for multiple environmental conditions while reducing expenses related to maintaining occupant comfort and disinfection.

SUMMARY

One implementation of the present disclosure is a heating, ventilation, or air conditioning (HVAC) system for one or more building zones. The HVAC system includes airside HVAC equipment operable to provide clean air to the one or more building zones and a controller. The controller is configured to obtain a dynamic temperature model and a dynamic infectious quanta model for the one or more building zones, determine an infection probability, and generate control decisions for the airside HVAC equipment using the dynamic temperature model, the dynamic infectious quanta model, and the infection probability. In some embodiments, the control decisions provide a desired level of disinfection. In some embodiments, the control decisions indicate an amount of the clean air to be provided to the one or more building zones by the airside HVAC equipment. Obtaining the dynamic temperature model and the dynamic infectious quanta model can include receiving one or both of the models as inputs, generating one or both of the models, retrieving one or both of the models from a database or from a user device, or otherwise obtaining one or both of the models in any other manner.

In some embodiments, the airside HVAC equipment includes disinfection lighting operable to disinfect the clean air before it is provided to the one or more building zones and one or more filters configured to filter the clean air before it is provided to the one or more building zones.

In some embodiments, the controller is configured to receive a desired level of disinfection via a user interface and generate a threshold value for the infection probability using the desired level of disinfection.

In some embodiments, the controller is configured to obtain a dynamic humidity model for the one or more building zones and use the dynamic humidity model, in addition to the dynamic temperature model and the dynamic infectious quanta model, to generate the control decisions.

In some embodiments, the one or more building zones include a plurality of building zones and the dynamic temperature model and the dynamic infectious quanta model are either individual dynamic models for each of the plurality of building zones or aggregate dynamic models for the plurality of building zones based on a weighted volume average of the plurality of zones.

In some embodiments, using the dynamic temperature model, the dynamic infectious quanta model, and the infection probability to generate the control decisions includes generating optimization constraints based on the dynamic temperature model, the dynamic infectious quanta model, and the infection probability and performing an optimization of an objective function subject to the optimization constraints to generate the control decisions as results of the optimization.

Another implementation of the present disclosure is a controller for a heating, ventilation, or air conditioning (HVAC) system of a building. The controller includes one or more processors and memory storing instructions that, when executed by the one or more processors, cause the one or more processors to perform operations including obtaining a dynamic temperature model and a dynamic infectious quanta model for one or more building zones of the building, determining an infection probability, and generating control decisions using the dynamic temperature model, the dynamic infectious quanta model, and the infection probability. The operations further include using the control decisions to operate at least one of disinfection lighting, a variable air volume (VAV) unit, or an air handling unit (AHU) of the HVAC system. In some embodiments, the control decisions provide a desired level of disinfection. In some embodiments, the control decisions indicate an amount of the clean air to be provided to the one or more building zones. Obtaining the dynamic temperature model and the dynamic infectious quanta model can include receiving one or both of the models as inputs, generating one or both of the models, retrieving one or both of the models from a database or from a user device, or otherwise obtaining one or both of the models in any other manner.

In some embodiments, the controller is configured to receive a desired level of disinfection via a user interface and generate a threshold value for the infection probability using the desired level of disinfection.

In some embodiments, the control signals are generated using a constraint on infectious quanta concentration based on a Wells-Riley Equation.

In some embodiments, the operations further include obtaining a dynamic humidity model for the one or more building zones and using the dynamic humidity model, in addition to the dynamic temperature model and the dynamic infectious quanta model, to generate the control decisions.

In some embodiments, the one or more building zones include a plurality of building zones and the dynamic temperature model and the dynamic infectious quanta model are either individual dynamic models for each of the plurality of building zones or aggregate dynamic models based on a weighted volume average of the plurality of building zones.

In some embodiments, using the dynamic temperature model, the dynamic infectious quanta model, and the infection probability to generate the control decisions includes generating optimization constraints based on the dynamic temperature model, the dynamic infectious quanta model, and the infection probability and performing an optimization of an objective function subject to the optimization constraints to generate the control decisions as results of the optimization.

In some embodiments, the control decisions indicate an amount of clean air to be provided to the one or more building zones and using the control decisions to operate the VAV unit includes generating both a temperature setpoint and a minimum airflow constraint for the VAV unit. The minimum airflow constraint may be the amount of clean air to be provided to the one or more building zones. Using the control decisions to operate the VAV unit may further include operating the VAV unit to control a temperature of the one or more building zones based on the temperature setpoint, subject to the minimum airflow constraint.

Another implementation of the present disclosure is a method for controlling building equipment to provide a desired level of disinfection. The method includes obtaining a dynamic temperature model and dynamic infectious quanta model for one or more building zones, determining an infection probability, and generating control decisions using the dynamic temperature model, the dynamic infectious quanta model, and the infection probability. The method includes using the control decisions to operate the building equipment to provide the amount of clean air to the one or more building zones. In some embodiments, the control decisions provide the desired level of disinfection. In some embodiments, the control decisions indicate an amount of clean air to be provided to the one or more building zones by the building equipment. Obtaining the dynamic temperature model and the dynamic infectious quanta model can include receiving one or both of the models as inputs, generating one or both of the models, retrieving one or both of the models from a database or from a user device, or otherwise obtaining one or both of the models in any other manner.

In some embodiments, using the dynamic temperature model, the dynamic infectious quanta model, and the infection probability to generate the control decisions includes generating optimization constraints based on the dynamic temperature model, the dynamic infectious quanta model, and the infection probability and performing an optimization of an objective function subject to the optimization constraints to generate the control decisions as results of the optimization.

In some embodiments, the controller is configured to receive the desired level of disinfection via a user interface and generate a threshold value for the infection probability using the desired level of disinfection.

In some embodiments, the method includes obtaining a dynamic humidity model for the one or more building zones and using the dynamic humidity model, in addition to the dynamic temperature model and the dynamic infectious quanta model, to generate the control decisions.

In some embodiments, the one or more building zones include a plurality of building zones and the dynamic temperature model and the dynamic infectious quanta model are either individual dynamic models for each of the plurality of building zones or aggregate dynamic models based on a weighted volume average of the plurality of building zones.

In some embodiments, the building equipment include at least one of disinfection lighting, a filter, an air handling unit (AHU), or a variable air volume (VAV) unit.

In some embodiments, the control decisions include at least one of commands to actuate the disinfection lighting between an on state and an off state, a fresh air intake fraction of the AHU, or an amount of airflow for the VAV unit to provide to the one or more building zones.

Another implementation of the present disclosure is a heating, ventilation, or air conditioning (HVAC) system for one or more building zones. The HVAC system includes airside HVAC equipment operable to provide clean air to the one or more building zones and a controller. The controller is configured to obtain a dynamic infectious quanta model for the one or more building zones, determine an infection probability, and generate control decisions for the airside HVAC equipment using the dynamic infectious quanta model and the infection probability. In some embodiments, the control decisions provide a desired level of disinfection. In some embodiments, the control decisions indicate an amount of the clean air to be provided to the one or more building zones by the airside HVAC equipment. In some embodiments, the controller is configured to obtain a dynamic temperature model for the one or more building zones and generate the control decisions using both the dynamic infectious quanta model and the dynamic temperature model. Obtaining the dynamic temperature model and the dynamic infectious quanta model can include receiving one or both of the models as inputs, generating one or both of the models, retrieving one or both of the models from a database or from a user device, or otherwise obtaining one or both of the models in any other manner.

Another implementation of the present disclosure is a heating, ventilation, or air conditioning system (HVAC) design and operational tool for a HVAC system for a building. The HVAC design and operational tool includes one or more processors and memory storing instructions that, when executed by the one or more processors, cause the one or more processors to perform operations including obtaining a dynamic temperature model and a dynamic infectious quanta model for one or more building zones, determining an infection probability, and performing a plurality of simulations for a plurality of different equipment configurations using the dynamic temperature model, the dynamic infectious quanta model, and the infection probability to generate results. The operations include generating, using the results of the plurality of simulations, at least one of design including one or more recommended design parameters data or operational data including one or more recommended operational parameters for the HVAC system and initiating an automated action using at least one of the design data or the operational data. Obtaining the dynamic temperature model and the dynamic infectious quanta model can include receiving one or both of the models as inputs, generating one or both of the models, retrieving one or both of the models from a database or from a user device, or otherwise obtaining one or both of the models in any other manner.

In some embodiments, the operations further include determining a dynamic humidity model for the one or more building zones and performing the plurality of simulations using the dynamic humidity model to generate the results.

In some embodiments, the one or more recommended design parameters indicate whether to include disinfection lighting for disinfection in the HVAC system, whether to include an air filter for disinfection in the HVAC system, and whether to use fresh air for disinfection in the HVAC system.

In some embodiments, the one or more recommended design parameters comprise a recommended rating of an air filter for use in the HVAC system.

In some embodiments, the automated action includes presenting at least one of the design data or the operational data to a user via a user interface.

In some embodiments, the plurality of simulations comprise at least two of a first simulation in which the HVAC system includes disinfection lighting but does not include an air filter for disinfection, a second simulation in which the HVAC system includes the air filter but does not include the disinfection lighting for disinfection, a third simulation in which the HVAC system includes both the disinfection lighting and the air filter for disinfection, and a fourth simulation in which the HVAC system includes neither of the disinfection lighting nor the air filter for disinfection.

In some embodiments, the operations further include generating an infectious quanta constraint based on a user input indicating a desired a level of disinfection, performing at least one of the plurality of simulations subject to the infectious quanta constraint to generate an estimated cost of operating the HVAC system, and presenting the estimated cost of operating the HVAC system via a user interface.

In some embodiments, the operations further include using the results of the plurality of simulations to provide a user interface that indicates a tradeoff between infection probability and at least one of energy cost or energy consumption.

In some embodiments, the recommended operational parameters comprise a recommended control scheme for the HVAC system.

Another implementation of the present disclosure is a heating, ventilation, or air conditioning (HVAC) system design and operational tool for a HVAC system for a building. The HVAC design and operational tool includes one or more processors and memory storing instructions that, when executed by the one or more processors, cause the one or more processors to perform operations including obtaining a dynamic temperature model and a dynamic infectious quanta model for one or more building zones, determining an infection probability, performing a simulation using the dynamic temperature model, the dynamic infectious quanta model, and the infection probability to generate results including a recommended equipment configuration of the HVAC system, and initiating an automated action using on the results. Obtaining the dynamic temperature model and the dynamic infectious quanta model can include receiving one or both of the models as inputs, generating one or both of the models, retrieving one or both of the models from a database or from a user device, or otherwise obtaining one or both of the models in any other manner.

In some embodiments, the operations further include obtaining a dynamic humidity model for the one or more building zones and performing the simulation using the dynamic humidity model to generate the results.

In some embodiments, the recommended equipment configuration indicates whether the HVAC system includes disinfection lighting for disinfection, whether the HVAC system includes a filter for disinfection, and whether the HVAC system uses fresh air for disinfection.

In some embodiments, the results comprise recommended equipment specifications indicating at least one of a recommended rating of an air filter or a recommended rating of disinfection lighting for disinfection.

In some embodiments, the automated action includes presenting the results via a user interface.

In some embodiments, performing the simulation includes optimizing an objective function indicating a cost of operating the HVAC system using one or more potential equipment configurations to provide a desired level of disinfection.

In some embodiments, the desired level of disinfection is a user-selected value.

In some embodiments, the operations further include generating an infectious quanta constraint based on a user input indicating a desired a level of disinfection, performing the simulation subject to the infectious quanta constraint to generate an estimated cost of operating the HVAC system, and presenting the estimated cost of operating the HVAC system via a user interface.

In some embodiments, the user input indicates a tradeoff between the desired level of disinfection and energy cost, the energy cost comprising at least one of an estimated energy consumption of the HVAC system or an estimated monetary cost of the energy consumption of the HVAC system.

Another implementation of the present disclosure is a method for providing design and operating recommendations for a heating, ventilation, or air conditioning (HVAC) system to achieve a desired level of infection control in a building. The method includes obtaining a dynamic temperature model and a dynamic infectious quanta model for one or more building zones, determining an infection probability, and using the dynamic temperature model, the dynamic infectious quanta model, and the infection probability to generate at least one of design recommendations or operating recommendations to achieve the desired level of infection control. The method further includes operating a display to provide the design recommendations or the operating recommendations to a user, each of the design recommendations or the operating recommendations including an associated cost. Obtaining the dynamic temperature model and the dynamic infectious quanta model can include receiving one or both of the models as inputs, generating one or both of the models, retrieving one or both of the models from a database or from a user device, or otherwise obtaining one or both of the models in any other manner.

In some embodiments, the design recommendations or the operating recommendations include at least one of a recommended equipment configuration of the HVAC system, recommended equipment specifications of the HVAC system, a recommended filter rating of a filter of the HVAC system, a recommended model of equipment of the HVAC system, or a recommended control scheme for the HVAC system.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Overview

Figure 1:
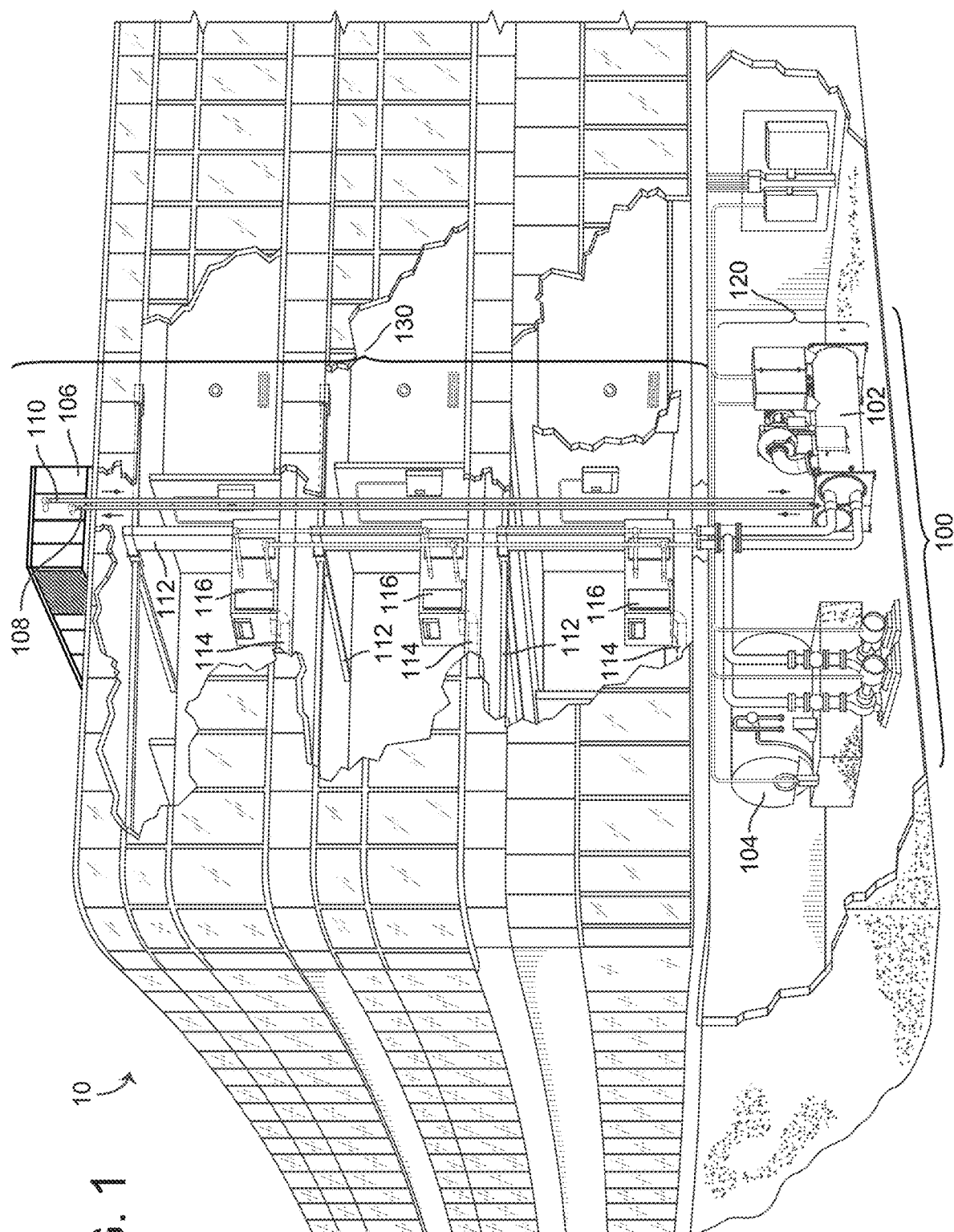
FIG. 1 is a drawing of a building equipped with a HVAC system, according to some embodiments.

Referring generally to the FIGURES, systems and methods for minimizing energy consumption of an HVAC system while maintaining a desired level of disinfection are shown. The system may include an AHU that serves multiple zones, a controller, one or more UV lights that disinfect air before it is provided from the AHU to the zones, and/or a filter that is configured to filter air to provide additional disinfection for the air before it is provided to the zones. In some embodiments, the system also includes one or more zone sensors (e.g., temperature and/or humidity sensors, etc.) and one or more ambient or outdoor sensors (e.g., outdoor temperature and/or outdoor humidity sensors, etc.).

The controller uses a model-based design and optimization framework to integrate building disinfection control with existing temperature regulation in building HVAC systems. The controller uses the Wells-Riley equation to transform a required upper limit of infection probability into constraints on indoor concentration of infectious particles, according to some embodiments. In some embodiments, the controller uses a dynamic model for infectious agent concentration to impose these constraints on an optimization problem similar to temperature and humidity constraints. By modeling effects of various types of optional infection control equipment (e.g., UV lights and/or filters), the controller may utilize a combination of fresh-air ventilation and direct filtration/disinfection to achieve desired infection constraints. In some embodiments, the controller can use this composite model for optimal design (e.g., in an off-line implementation of the controller) to determine which additional disinfection strategies are desirable, cost effective, or necessary. The controller can also be used for on-line control to determine control decisions for various controllable equipment (e.g., dampers of the AHU) in real-time to minimize energy consumption or energy costs of the HVAC system while meeting temperature, humidity, and infectious quanta concentration constraints.

The systems and methods described herein treat infection control as an integral part of building HVAC operation rather than a short term or independent control objective, according to some embodiments. While it may be possible to achieve disinfection by the addition of UV lights and filters running at full capacity, such a strategy may be costly and consume excessive amounts of energy. However, the systems and methods described herein couple both objectives (disinfection control and minimal energy consumption) to assess optimal design and operational decisions on a case-by-case basis also taking into account climate, energy and disinfection goals of particular buildings.

The controller can be implemented in an off-line mode as a design tool. With the emergence of various strategies for building disinfection, building designers and operators now have a wide array of options for retrofitting a building to reduce the spread of infectious diseases to building occupants. This is typically accomplished by lowering the concentration of infectious particles in the air space, which can be accomplished by killing the microbes via UV radiation, trapping them via filtration, or simply forcing them out of the building via fresh-air ventilation. While any one of these strategies individually can provide desired levels of disinfection, it may do so at unnecessarily high cost or with negative consequences for thermal comfort of building occupants. Thus, to help evaluate the tradeoff and potential synergies between the various disinfection options, the model-based design tool can estimate annualized capital and energy costs for a given set of disinfection equipment. For a given AHU, this includes dynamic models for temperature, humidity, and infectious particle concentration, and it employs the Wells-Riley infection equation to enforce constraints on maximum occupant infection probability. By being able to quickly simulate a variety of simulation instances, the controller (when operating as the design tool in the off-line mode) can present building designers with the tradeoff between cost and disinfection, allowing them to make informed decisions about retrofit.

A key feature of the design tool is that it shows to what extent the inherent flexibility of the existing HVAC system can be used to provide disinfection. In particular, in months when infectivity is of biggest concern, a presence of free cooling from fresh outdoor air means that the energy landscape is relatively flat regardless of how the controller determines to operate the HVAC system. Thus, the controller could potentially increase fresh-air intake significantly to provide sufficient disinfection without UV or advanced filtration while incurring only a small energy penalty. The design tool can provide estimates to customers to allow them to make informed decisions about what additional disinfection equipment (if any) to install and then provide the modified control systems needed to implement the desired infection control.

The controller can also be implemented in an on-line mode as a real-time controller. Although equipment like UV lamps and advanced filtration can be installed in buildings to mitigate the spread of infectious diseases, it is often unclear how to best operate that equipment to achieve desired disinfection goals in a cost-effective manner. A common strategy is to take the robust approach of opting for the highest-efficiency filters and running UV lamps constantly. While this strategy will indeed reduce infection probability to its lowest possible value, it is likely to do so at exorbitant cost due to the constant energy penalties of both strategies.

Building managers may potentially choose to completely disable filters and UV lamps to conserve energy consumption. Thus, the building may end up in a worst-of-both-words situation where the building manager has paid for disinfection equipment but the zones are no longer receiving any disinfection. To remove this burden from building operators, the controller can automate infection control by integrating disinfection control (e.g., based on the Wells-Riley equation) in a model based control scheme. In this way, the controller can simultaneously achieve thermal comfort and provide adequate disinfection at the lowest possible cost given currently available equipment.

Advantageously, the control strategy can optimize in real time the energy and disinfection tradeoffs of all possible control variables. Specifically, the controller may choose to raise fresh-air intake fraction even though it incurs a slight energy penalty because it allows a significant reduction of infectious particle concentrations while still maintaining comfortable temperatures. Thus, in some climates it may be possible to provide disinfection without additional equipment, but this strategy is only possible if the existing control infrastructure can be guided or constrained so as to provide desired disinfection. Alternatively, in buildings that have chosen to add UV lamps and/or filtration, the controller can find the optimal combination of techniques to achieve desired control objectives at the lowest possible cost. In addition, because the constraint on infection probability is configurable, the controller can empower building operators to make their own choices regarding disinfection and energy use (e.g. opting for a loose constraint in the summer when disease is rare and energy use is intensive, while transitioning to a tight constraint in winter when disease is prevalent and energy less of a concern). Advantageously, the controller can provide integrated comfort, disinfection, and energy management to customers to achieve better outcomes in all three areas compared to other narrow and individual solutions.

In some embodiments, the models used to predict temperature, humidity, and/or infectious quanta are dynamic models. The term "dynamic model" and variants thereof (e.g., dynamic temperature model, dynamic humidity model, dynamic infectious quanta model, etc.) are used throughout the present disclosure to refer to any type of model that predicts the value of a quantity (e.g., temperature, humidity, infectious quanta) at various points in time as a function of zero or more input variables. A dynamic model may be "dynamic" as a result of the input variables changing over time even if the model itself does not change. For example, a steady-state model that uses ambient temperature or any other variable that changes over time as an input may be considered a dynamic model. Dynamic models may also include models that vary over time. For example, models that are retrained periodically, configured to adapt to changing conditions over time, and/or configured to use different relationships between input variables and predicted outputs (e.g., a first set of relationships for winter months and a second set of relationships for summer months) may also be considered dynamic models. Dynamic models may also include ordinary differential equation (ODE) models or other types of models having input variables that change over time and/or input variables that represent the rate of change of a variable.

Building and HVAC System

Referring now to FIG. 1, a perspective view of a building 10 is shown. Building 10 can be served by a building management system (BMS). A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof. An example of a BMS which can be used to monitor and control building 10 is described in U.S. patent application Ser. No. 14/717,593 filed May 20, 2015, the entire disclosure of which is incorporated by reference herein.

The BMS that serves building 10 may include a HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. In some embodiments, waterside system 120 can be replaced with or supplemented by a central plant or central energy facility (described in greater detail with reference to FIG. 2). An example of an airside system which can be used in HVAC system 100 is described in greater detail with reference to FIG. 2.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Airside System

Figure 2:
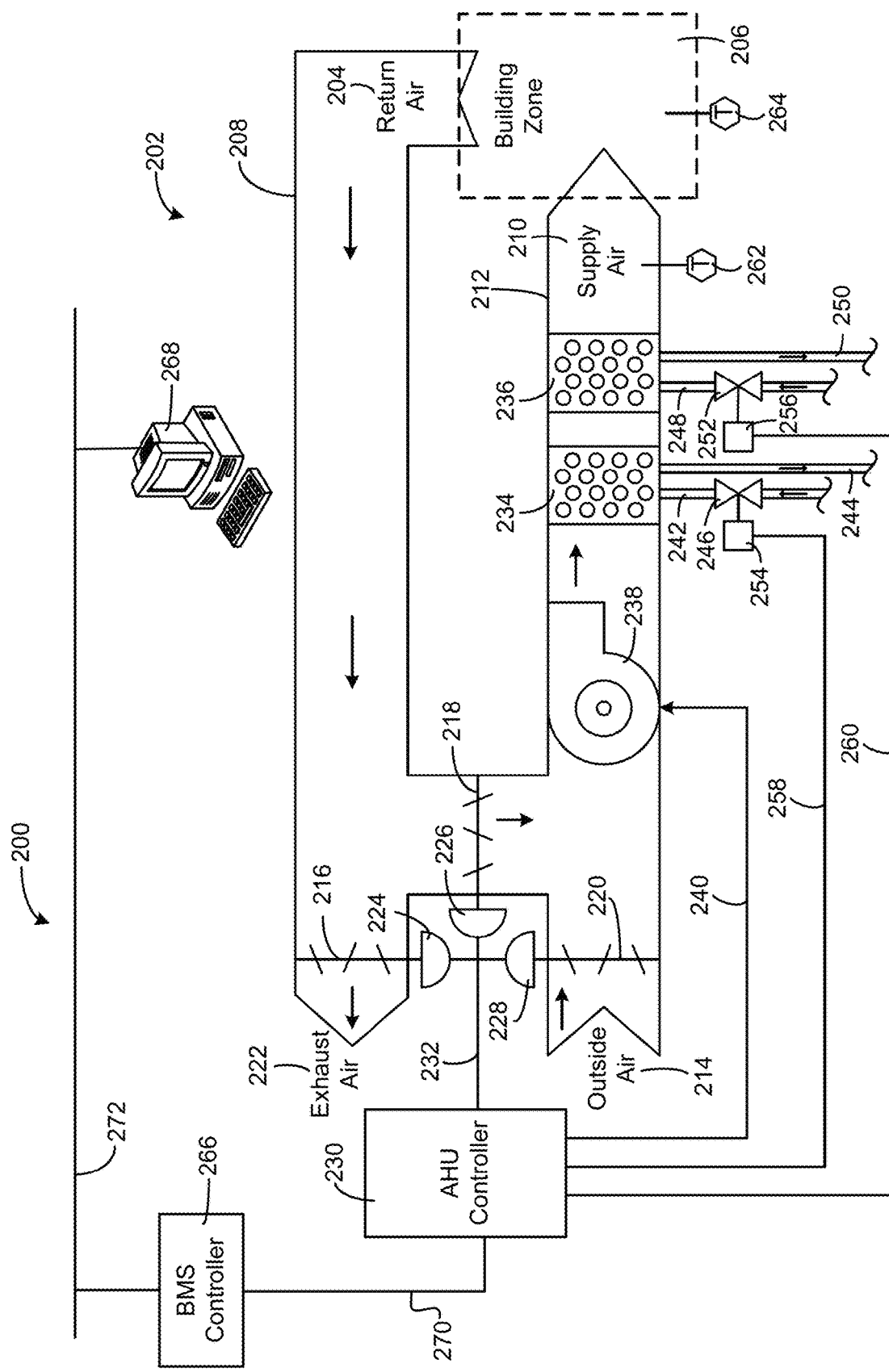
FIG. 2 is a block diagram of an airside system which can be implemented in the building of FIG. 1, according to some embodiments.

Referring now to FIG. 2, a block diagram of an airside system 200 is shown, according to some embodiments. In various embodiments, airside system 200 may supplement or replace airside system 130 in HVAC system 100 or can be implemented separate from HVAC system 100. When implemented in HVAC system 100, airside system 200 can include a subset of the HVAC devices in HVAC system 100 (e.g., AHU 106, VAV units 116, ducts 112-114, fans, dampers, etc.) and can be located in or around building 10. Airside system 200 may operate to heat, cool, humidify, dehumidify, filter, and/or disinfect an airflow provided to building 10 in some embodiments.

Airside system 200 is shown to include an economizer-type air handling unit (AHU) 202. Economizer-type AHUs vary the amount of outside air and return air used by the air handling unit for heating or cooling. For example, AHU 202 may receive return air 204 from building zone 206 via return air duct 208 and may deliver supply air 210 to building zone 206 via supply air duct 212. In some embodiments, AHU 202 is a rooftop unit located on the roof of building 10 (e.g., AHU 106 as shown in FIG. 1) or otherwise positioned to receive both return air 204 and outside air 214. AHU 202 can be configured to operate exhaust air damper 216, mixing damper 218, and outside air damper 220 to control an amount of outside air 214 and return air 204 that combine to form supply air 210. Any return air 204 that does not pass through mixing damper 218 can be exhausted from AHU 202 through exhaust damper 216 as exhaust air 222.

Each of dampers 216-220 can be operated by an actuator. For example, exhaust air damper 216 can be operated by actuator 224, mixing damper 218 can be operated by actuator 226, and outside air damper 220 can be operated by actuator 228. Actuators 224-228 may communicate with an AHU controller 230 via a communications link 232. Actuators 224-228 may receive control signals from AHU controller 230 and may provide feedback signals to AHU controller 230. Feedback signals can include, for example, an indication of a current actuator or damper position, an amount of torque or force exerted by the actuator, diagnostic information (e.g., results of diagnostic tests performed by actuators 224-228), status information, commissioning information, configuration settings, calibration data, and/or other types of information or data that can be collected, stored, or used by actuators 224-228. AHU controller 230 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 224-228.

Still referring to FIG. 2, AHU 202 is shown to include a cooling coil 234, a heating coil 236, and a fan 238 positioned within supply air duct 212. Fan 238 can be configured to force supply air 210 through cooling coil 234 and/or heating coil 236 and provide supply air 210 to building zone 206. AHU controller 230 may communicate with fan 238 via communications link 240 to control a flow rate of supply air 210. In some embodiments, AHU controller 230 controls an amount of heating or cooling applied to supply air 210 by modulating a speed of fan 238. In some embodiments, AHU 202 includes one or more air filters (e.g., filter 308) and/or one or more ultraviolet (UV) lights (e.g., UV lights 306) as described in greater detail with reference to FIG. 3. AHU controller 230 can be configured to control the UV lights and route the airflow through the air filters to disinfect the airflow as described in greater detail below.

Cooling coil 234 may receive a chilled fluid from central plant 200 (e.g., from cold water loop 216) via piping 242 and may return the chilled fluid to central plant 200 via piping 244. Valve 246 can be positioned along piping 242 or piping 244 to control a flow rate of the chilled fluid through cooling coil 234. In some embodiments, cooling coil 234 includes multiple stages of cooling coils that can be independently activated and deactivated (e.g., by AHU controller 230, by BMS controller 266, etc.) to modulate an amount of cooling applied to supply air 210.

Heating coil 236 may receive a heated fluid from central plant 200 (e.g., from hot water loop 214) via piping 248 and may return the heated fluid to central plant 200 via piping 250. Valve 252 can be positioned along piping 248 or piping 250 to control a flow rate of the heated fluid through heating coil 236. In some embodiments, heating coil 236 includes multiple stages of heating coils that can be independently activated and deactivated (e.g., by AHU controller 230, by BMS controller 266, etc.) to modulate an amount of heating applied to supply air 210.

Each of valves 246 and 252 can be controlled by an actuator. For example, valve 246 can be controlled by actuator 254 and valve 252 can be controlled by actuator 256. Actuators 254-256 may communicate with AHU controller 230 via communications links 258-260. Actuators 254-256 may receive control signals from AHU controller 230 and may provide feedback signals to controller 230. In some embodiments, AHU controller 230 receives a measurement of the supply air temperature from a temperature sensor 262 positioned in supply air duct 212 (e.g., downstream of cooling coil 334 and/or heating coil 236). AHU controller 230 may also receive a measurement of the temperature of building zone 206 from a temperature sensor 264 located in building zone 206.

In some embodiments, AHU controller 230 operates valves 246 and 252 via actuators 254-256 to modulate an amount of heating or cooling provided to supply air 210 (e.g., to achieve a setpoint temperature for supply air 210 or to maintain the temperature of supply air 210 within a setpoint temperature range). The positions of valves 246 and 252 affect the amount of heating or cooling provided to supply air 210 by cooling coil 234 or heating coil 236 and may correlate with the amount of energy consumed to achieve a desired supply air temperature. AHU 230 may control the temperature of supply air 210 and/or building zone 206 by activating or deactivating coils 234-236, adjusting a speed of fan 238, or a combination of both.

Still referring to FIG. 2, airside system 200 is shown to include a building management system (BMS) controller 266 and a client device 268. BMS controller 266 can include one or more computer systems (e.g., servers, supervisory controllers, subsystem controllers, etc.) that serve as system level controllers, application or data servers, head nodes, or master controllers for airside system 200, central plant 200, HVAC system 100, and/or other controllable systems that serve building 10. BMS controller 266 may communicate with multiple downstream building systems or subsystems (e.g., HVAC system 100, a security system, a lighting system, central plant 200, etc.) via a communications link 270 according to like or disparate protocols (e.g., LON, BACnet, etc.). In various embodiments, AHU controller 230 and BMS controller 266 can be separate (as shown in FIG. 2) or integrated. In an integrated implementation, AHU controller 230 can be a software module configured for execution by a processor of BMS controller 266.

In some embodiments, AHU controller 230 receives information from BMS controller 266 (e.g., commands, setpoints, operating boundaries, etc.) and provides information to BMS controller 266 (e.g., temperature measurements, valve or actuator positions, operating statuses, diagnostics, etc.). For example, AHU controller 230 may provide BMS controller 266 with temperature measurements from temperature sensors 262-264, equipment on/off states, equipment operating capacities, and/or any other information that can be used by BMS controller 266 to monitor or control a variable state or condition within building zone 206.

Client device 268 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 268 can be a computer workstation, a client terminal, a remote or local interface, or any other type of user interface device. Client device 268 can be a stationary terminal or a mobile device. For example, client device 268 can be a desktop computer, a computer server with a user interface, a laptop computer, a tablet, a smartphone, a PDA, or any other type of mobile or non-mobile device. Client device 268 may communicate with BMS controller 266 and/or AHU controller 230 via communications link 272.

HVAC System with Building Infection Control

Overview

Figure 3:
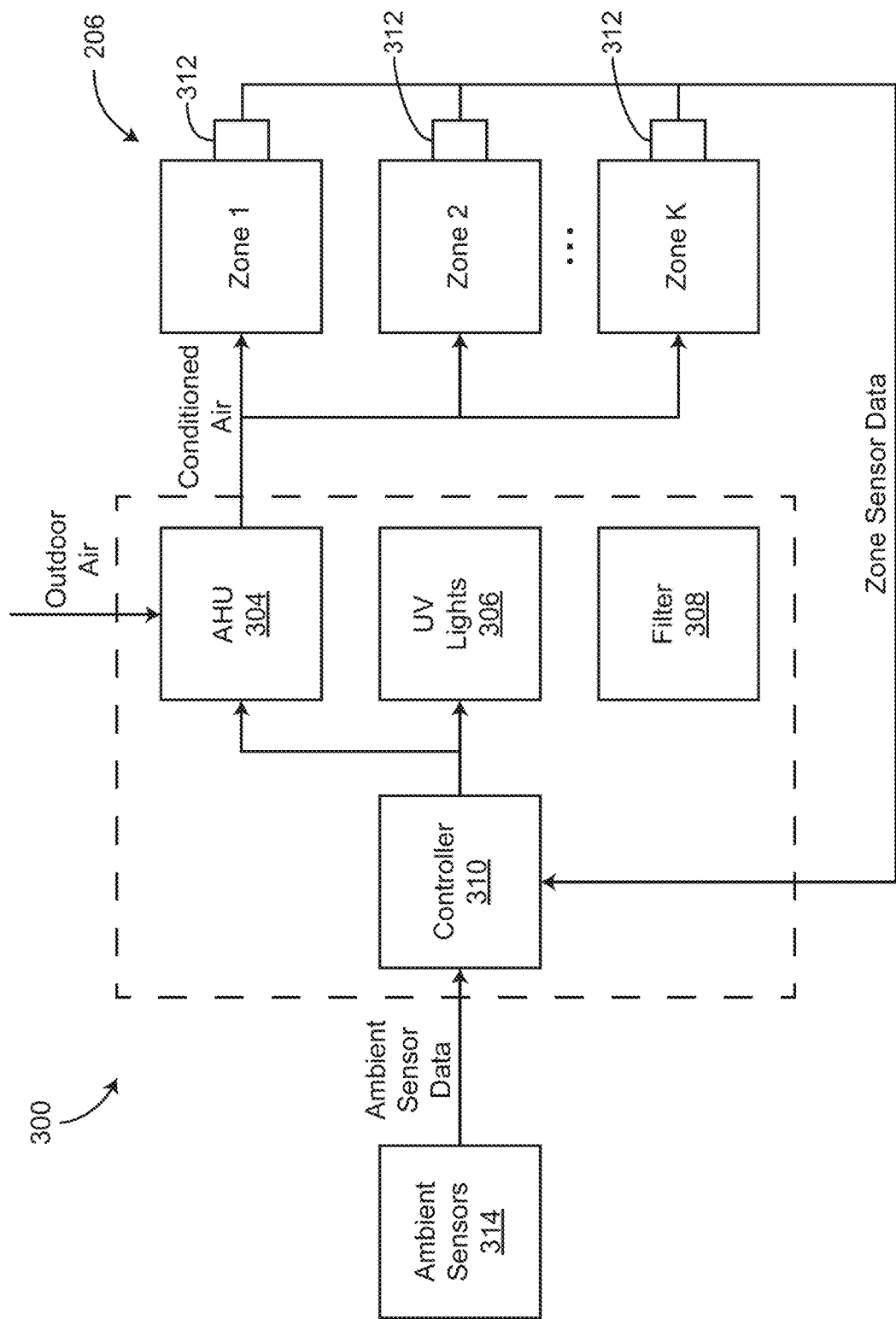
FIG. 3 is a block diagram of an HVAC system including a controller configured to operate an air-handling unit (AHU) of the HVAC system of FIG. 1, according to some embodiments.

Referring particularly to FIG. 3, a HVAC system 300 that is configured to provide disinfection for various zones of a building (e.g., building 10) is shown, according to some embodiments. HVAC system 300 can include an air handling unit (AHU) 304 (e.g., AHU 230, AHU 202, etc.) that can provide conditioned air (e.g., cooled air, supply air 210, etc.) to various building zones 206. The AHU 304 may draw air from the zones 206 in combination with drawing air from outside (e.g., outside air 214) to provide conditioned or clean air to zones 206. The HVAC system 1400 includes a controller 310 (e.g., AHU controller 230) that is configured to determine a fraction x of outdoor air to recirculated air that the AHU 304 should use to provide a desired amount of disinfection to building zones 206. In some embodiments, controller 310 can generate control signals for various dampers of AHU 304 so that AHU 304 operates to provide the conditioned air to building zones 206 using the fraction x.

The HVAC system 300 can also include ultraviolet (UV) lights 306 that are configured to provide UV light to the conditioned air before it is provided to building zones 206. The UV lights 306 can provide disinfection as determined by controller 310 and/or based on user operating preferences. For example, the controller 310 can determine control signals for UV lights 306 in combination with the fraction x of outdoor air to provide a desired amount of disinfection and satisfy an infection probability constraint. Although UV lights 306 are referred to throughout the present disclosure, the systems and methods described herein can use any type of disinfection lighting using any frequency, wavelength, or luminosity of light effective for disinfection. It should be understood that UV lights 306 (and any references to UV lights 306 throughout the present disclosure) can be replaced with disinfection lighting of any type without departing from the teachings of the present disclosure.

The HVAC system 300 can also include one or more filters 308 or filtration devices (e.g., air purifiers). In some embodiments, the filters 308 are configured to filter the conditioned air or recirculated air before it is provided to building zones 206 to provide a certain amount of disinfection. In this way, controller 310 can perform an optimization in real-time or as a planning tool to determine control signals for AHU 304 (e.g., the fraction x) and control signals for UV lights 306 (e.g., on/off commands) to provide disinfection for building zones 206 and reduce a probability of infection of individuals that are occupying building zones 206. Controller 310 can also function as a design tool that is configured to determine suggestions for building managers regarding benefits of installing or using filters 308, and/or specific benefits that may arise from using or installing a particular type or size of filter. Controller 310 can thereby facilitate informed design decisions to maintain sterilization of air that is provided to building zones 206 and reduce a likelihood of infection or spreading of infectious matter.

Wells-Riley Airborne Transmission

The systems and methods described herein may use an infection probability constraint in various optimizations (e.g., in on-line or real-time optimizations or in off-line optimizations) to facilitate reducing infection probability among residents or occupants of spaces that the HVAC system serves. The infection probability constraint can be based on a steady-state Wells-Riley equation for a probability of airborne transmission of an infectious agent given by:

$$P := \frac{D}{S} = 1 - \exp\left(-\frac{Ipqt}{Q}\right)$$

where P is a probability that an individual becomes infected (e.g., in a zone, space, room, environment, etc.), D is a number of infected individuals (e.g., in the zone, space, room, environment, etc.), S is a total number of susceptible individuals (e.g., in the zone, space, room, environment, etc.), I is a number of infectious individuals (e.g., in the zone, space, room, environment, etc.), q is a disease quanta generation rate (e.g., with units of 1/sec), p is a volumetric breath rate of one individual (e.g., in m³/sec), t is a total exposure time (e.g., in seconds), and Q is an outdoor ventilation rate (e.g., in m³/sec). For example, Q may be a volumetric flow rate of fresh outdoor air that is provided to the building zones 206 by AHU 304.

When the Wells-Riley equation is implemented by controller 310 as described herein, controller 310 may use the Wells-Riley equation (or a dynamic version of the Wells-Riley equation) to determine an actual or current probability of infection P and operate the HVAC system 200 to maintain the actual probability of infection P below (or drive the actual probability of infection below) a constraint or maximum allowable value. The constraint value (e.g., $P_{max}$) may be a constant value, or may be adjustable by a user (e.g., a user-set value). For example, the user may set the constraint value of the probability of infection to a maximum desired probability of infection (e.g., either for on-line implementation of controller 310 to maintain the probability of infection below the maximum desired probability, or for an off-line implementation/simulation performed by controller 310 to determine various design parameters for HVAC system 200 such as filter size), or may select from various predetermined values (e.g., 3-5 different choices of the maximum desired probability of infection).

In some embodiments, the number of infectious individuals I can be determined by controller 310 based on data from the Centers for Disease and Control Prevention or a similar data source. The value of 1 may be typically set equal to 1 but may vary as a function of occupancy of building zones 206.

The disease quanta generation rate q may be a function of the infectious agent. For example, more infectious diseases may have a higher value of q, while less infectious diseases may have a lower value of q. For example, the value of q for COVID-19 may be 30-300 (e.g., 100).

The value of the volumetric breath rate p may be based on a type of building space 206. For example, the volumetric breath rate p may be higher if the building zone 206 is a gym as opposed to an office setting. In general, an expected level of occupant activity may determine the value of the volumetric breath rate p.

A difference between D (the number of infected individuals) and I (the number of infectious individuals) is that D is a number of individuals who are infected (e.g., infected with a disease), while I is a number of people that are infected and are actively contagious (e.g., individuals that may spread the disease to other individuals or spread infectious particles when they exhale). The disease quanta generation rate indicates a number of infectious droplets that give a 63.2% chance of infecting an individual (e.g., 1−exp(−1)). For example, if an individual inhales k infectious particles, the probability that the individual becomes infected (P) is given by $$1 - \exp\left(-\frac{k}{k_0}\right)$$

where k is the number of infectious particles that the individual has inhaled, and $k_0$ is a quantum of particles for a particular disease (e.g., a predefined value for different diseases). The quanta generation rate q is the rate at which quanta are generated (e.g., $K/k_0$) where K is the rate of infectious particles exhaled by an infectious individual. It should be noted that values of the disease quanta generation rate q may be back-calculated from epidemiological data or may be tabulated for well-known diseases.

The Wells-Riley equation (shown above) is derived by assuming steady-state concentrations for infectious particles in the air. Assuming a well-mixed space:

$$V\frac{dN}{dt} = Iq - NQ$$

where V is a total air volume (e.g., in $m^3$), N is a quantum concentration in the air, I is the number of infectious individuals, q is the disease quanta generation rate, and Q is the outdoor ventilation rate. The term Iq is quanta production by infectious individuals (e.g., as the individuals breathe out or exhale), and the term NQ is the quanta removal rate due to ventilation (e.g., due to operation of AHU 304).

Assuming steady-state conditions, the steady state quantum concentration in the air is expressed as:

$$N_{ss} = \frac{Iq}{Q}$$

according to some embodiments.

Therefore, if an individual inhales at an average rate of p (e.g., in $m^3$/sec), over a period of length t the individual inhales a total volume pt or $N_{ss}ptk_0$ infectious particles. Therefore, based on a probability model used to define the quanta, the infectious probability is given by:

$$P = 1 - \exp\left(-\frac{k}{k_0}\right) = 1 - \exp(-N_{SS}pt) = 1 - \exp\left(-\frac{Iqpt}{Q}\right)$$

where P is the probability that an individual becomes infected, k is the number of infectious particles that the individual has inhaled, and $k_0$ is the quantum of particles for the particular disease.

Carbon Dioxide for Infectious Particles Proxy

While the above equations may rely on in-air infectious quanta concentration, measuring in-air infectious quanta concentration may be difficult. However, carbon dioxide ($CO_2$) is a readily-measureable parameter that can be a proxy species, measured by zone sensors 312. In some embodiments, a concentration of $CO_2$ in the zones 206 may be directly related to a concentration of the infectious quanta.

A quantity φ that defines a ratio of an infected particle concentration in the building air to the infected particle concentration in the exhaled breath of an infectious individual is defined:

$$\phi := \frac{pN}{q}$$

where p is the volumetric breath rate for an individual, N is the quantum concentration in the air, and q is the disease quanta generation rate. Deriving the above equation with respect to time yields:

$$\frac{d\phi}{dt} = \frac{p}{q}\left(\frac{dN}{dt}\right) = \frac{Ip}{V} - \phi\left(\frac{Q}{V}\right)$$

where p is the volumetric breath rate for the individual, q is disease quanta generation rate, N is the quantum concentration in the air, t is time, I is the number of infectious individuals, V is the total air volume, φ is the ratio, and Q is the outdoor ventilation rate. Since it can be difficult to measure the ratio φ of the air, $CO_2$ can be used as a proxy species.

Humans release $CO_2$ when exhaling, which is ultimately transferred to the ambient via ventilation of an HVAC system. Therefore, the difference between $CO_2$ particles and infectious particles is that all individuals (and not only the infectious population) release $CO_2$ and that the outdoor air $CO_2$ concentration is non-zero. However, it may be assumed that the ambient $CO_2$ concentration is constant with respect to time, which implies that a new quantity C can be defined as the net indoor $CO_2$ concentration (e.g., the indoor concentration minus the outdoor concentration). With this assumption, the following differential equation can be derived:

$$V\frac{dC}{dt} = Spc - QC$$

where V is the total air volume (e.g., in m³), C is the net indoor CO2 concentration, t is time, S is the total number of susceptible individuals (e.g., in building zone 206, or a modeled space, or all of building zones 206, or building 10), p is the volumetric breath rate for one individual, c is the net concentration of exhaled CO2, and Q is the outdoor ventilation rate. This equation assumes that the only way to remove infectious particles is with fresh air ventilation (e.g., by operating AHU 304 to draw outdoor air and use the outdoor air with recirculated air). A new quantity ψ can be defined that gives the ratio of net CO2 concentration in the building air to net CO2 concentration in the exhaled air:

$$\psi = \frac{C}{c}$$

where ψ is the ratio, C is the net indoor CO2 concentration, and c is the net concentration of exhaled CO2.

Deriving the ratio ψ with respect to time yields:

$$\frac{d\psi}{dt} = \frac{1}{c}\left(\frac{dC}{dt}\right) = \frac{Sp}{V} - \psi\left(\frac{Q}{V}\right)$$

according to some embodiments.

Combining the above equation with the quantity φ, it can be derived that:

$$\frac{d}{dt}\log\left(\frac{\phi}{\psi}\right) = \frac{1}{\phi}\left(\frac{d\phi}{dt}\right) - \frac{1}{\psi}\left(\frac{d\psi}{dt}\right) = \frac{p}{V}\left(\frac{I}{\phi} - \frac{S}{\psi}\right)$$

according to some embodiments. Assuming that the initial condition satisfies:

$$\phi(0) = \frac{1}{S}\psi(0)$$

it can be determined that the right-hand side of the $$\frac{d}{dt}\log\left(\frac{\phi}{\psi}\right)$$

equation becomes zero. This implies that the term log $$\left(\frac{\phi}{\psi}\right)$$

and therefore $$\frac{\phi}{\psi}$$

is a constant. Therefore, φ/ψ is constant for all times t and not merely initial conditions when t=0.

The $$\frac{d}{dt}\log\left(\frac{\phi}{\psi}\right)$$

relationship only holds true when fresh outdoor air is used as the only disinfection mechanism. However, in many cases HVAC system 200 may include one or more filters 308, and UV lights 306 that can be operated to provide disinfection for building zones 206. If additional infection mitigation strategies are used, the ventilation rate may instead by an effective ventilation rate for infectious quanta that is different than that of the CO2. Additionally, the only way for the initial conditions φ(0) and ψ(0) to be in proportion is for both to be zero. This assumption can be reasonable if HVAC system 200 operates over a prolonged time period (such as overnight, when the concentrations have sufficient time to reach equilibrium zero values). However, ventilation is often partially or completely disabled overnight and therefore the two quantities φ and ψ are not related. However, CO2 concentration can be measured to determine common model parameters (e.g., for the overall system volume V) without being used to estimate current infectious particle concentrations. If fresh outdoor air ventilation is the only mechanism for disinfection of zones 206, and the HVAC system 200 is run so that the concentrations reach equilibrium, CO2 concentration can be measured and used to estimate current infectious particle concentrations.

Dynamic Extension and Infection Probability Constraints

Referring still to FIG. 3, it may be desirable to model the infectious quanta concentration N of building zones 206 as a dynamic parameter rather than assuming N is equal to the steady state $N_{ss}$ value. For example, if infectious individuals enter building zones 206, leave building zones 206, etc., the infectious quanta concentration N may change over time. This can also be due to the fact that the effective fresh air ventilation rate (which includes outdoor air intake as well as filtration or UV disinfection that affects the infectious agent concentration in the supply air that is provided by AHU 304 to zones 206) can vary as HVAC system 200 operates.

Therefore, assuming that the infectious quanta concentration N(t) is a time-varying quantity, for a given time period t∈[0, T], an individual breathes in:

$$k_{[0,T]} = \int_0^T pk_0 N(t)dt$$

where $k_{[0,T]}$ is the number of infectious particles that an individual inhales over the given time period [0, T], p is the volumetric breath rate of one individual, $k_0$ is the quantum of particles for a particular disease, and N(t) is the time-varying quantum concentration of the infectious particle in the air.

Since $$P = 1 - \exp\left(-\frac{k}{k_0}\right),$$

the above equation can be rearranged and substitution yields:

$$-\log(1 - P_{[0,T]}) = \int_0^T pN(t)dt \approx \Delta\sum_t pN_t$$

according to some embodiments.

Assuming an upper boundary $P_{[0,T]}^{max}$ on acceptable or desirable infection probability, a constraint is defined as:

$$\frac{\Delta}{T}\sum_t N_t \leq -\frac{1}{pT}\log(1 - P_{[0,T]})$$

according to some embodiments. The constraint can define a fixed upper boundary on an average value of $N_t$ over the given time interval.

Control Formulation

Figure 4:
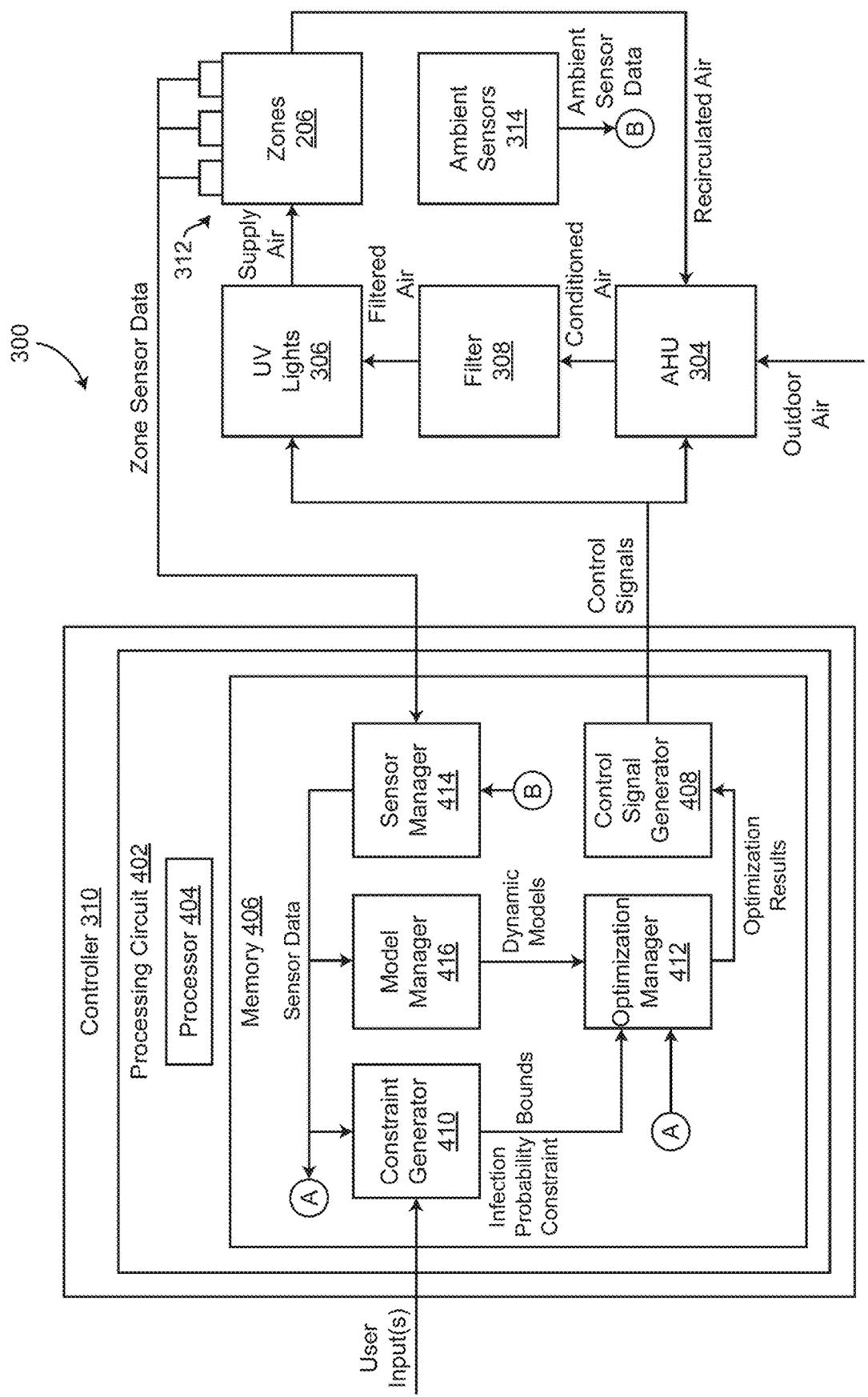
FIG. 4 is a block diagram illustrating the controller of FIG. 3 in greater detail, showing operations performed when the controller is used in an on-line mode or real-time implementation for making control decisions to minimize energy consumption of the HVAC system and provide sufficient disinfection, according to some embodiments.

Referring particularly to FIG. 4, controller 310 is shown in greater detail, according to some embodiments. Controller 310 is configured to generate control signals for any of UV lights 306, filter 308, and/or AHU 304. AHU 304 operates to draw outdoor air and/or recirculated air (e.g., from zones 206) to output conditioned (e.g., cooled) air. The conditioned air may be filtered by passing through filter 308 (e.g., which may include fans to draw the air through the filter 308) to output filtered air. The filtered air and/or the conditioned air can be disinfected through operation of UV lights 306. The AHU 304, filter 308, and UV lights 306 can operate in unison to provide supply air to zones 206.

Controller 310 includes a processing circuit 402 including a processor 404 and memory 406. Processing circuit 402 can be communicably connected with a communications interface of controller 310 such that processing circuit 402 and the various components thereof can send and receive data via the communications interface. Processor 404 can be implemented as a general purpose processor, an application specific integrated circuit (ASIC), one or more field programmable gate arrays (FPGAs), a group of processing components, or other suitable electronic processing components.

Memory 406 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 406 can be or include volatile memory or non-volatile memory. Memory 406 can include database components, object code components, script components, or any other type of information structure for supporting the various activities and information structures described in the present application. According to some embodiments, memory 406 is communicably connected to processor 404 via processing circuit 402 and includes computer code for executing (e.g., by processing circuit 402 and/or processor 404) one or more processes described herein.

In some embodiments, controller 310 is implemented within a single computer (e.g., one server, one housing, etc.). In various other embodiments controller 310 can be distributed across multiple servers or computers (e.g., that can exist in distributed locations).

Memory 406 can include a constraint generator 410, a model manager 416, a sensor manager 414, an optimization manager 412, and a control signal generator 408. Sensor manager 414 can be configured to obtain zone sensor data from zone sensors 312 and/or ambient sensor data from ambient sensors 314 (e.g., environmental conditions, outdoor temperature, outdoor humidity, etc.) and distribute required sensor data to the various components of memory 406 thereof. Constraint generator 410 is configured to generate one or more constraints for an optimization problem (e.g., an infection probability constraint) and provide the constraints to optimization manager 412. Model manager 416 can be configured to generate dynamic models (e.g., individual or zone-by-zone dynamic models, aggregate models, etc.) and provide the dynamic models to optimization manager 412. Optimization manager 412 can be configured to use the constraints provided by constraint generator 410 and the dynamic models provided by model manager 416 to formulate an optimization problem. Optimization manager 412 can also define an objective function for the optimization problem, and minimize or optimize the objective function subject to the one or more constraints and the dynamic models. The objective function may be a function that indicates an amount of energy consumption, energy consumption costs, carbon footprint, or any other optimization goals over a time interval or time horizon (e.g., a future time horizon) as a function of various control decisions. Optimization manager 412 can output optimizations results to control signal generator 408. Control signal generator 408 can generate control signals based on the optimization results and provide the control signals to any of AHU 304, filter 308, and/or UV lights 306.

Referring particularly to FIGS. 3 and 4, AHU 304 can be configured to serve multiple building zones 206. For example, AHU 304 can be configured to serve a collection of zones 206 that are numbered k=1, ..., K. Each zone 206 can have a temperature, referred to as temperature $T_k$ (the temperature of the kth zone 206), a humidity $\omega_k$ (the humidity of the kth zone 206), and an infectious quanta concentration $N_k$ (the infectious quanta concentration of the kth zone 206). Using this notation, the following dynamic models of individual zones 206 can be derived:

$$\rho c V_k \left(\frac{dT_k}{dt}\right) = \rho c f_k (T_0 - T_k) + Q_k(T_k)$$

$$\rho V_k \left(\frac{d\omega_k}{dt}\right) = \rho f(\omega_0 - T_0) + w_k$$

$$V_k \left(\frac{dN_k}{dt}\right) = f_k(N_0 - N_k) + I_k q$$

where $f_k$ is a volumetric flow of air into the kth zone, $\rho$ is a mass density of air (e.g., in kg per cubic meters), c is the heat capacity of air (e.g., in kJ/kg·K), $Q_k(\cdot)$ is heat load on the kth zone 206 (which may depend on the temperature $T_k$), $w_k$ is the moisture gain of the kth zone 206, and $I_k$ is the number of infectious individuals in the kth zone 206. $T_0$ is the temperature of the air provided to the kth zone (e.g., as discharged by a VAV box of AHU 304), $\omega_0$ is the humidity of the air provided to the kth zone 206, and $N_0$ is the infectious quanta concentration of the air provided to the kth zone 206.

The temperature $T_0$ of air output by the AHU 304, the humidity $\omega_0$ of air output by the AHU 304, and the infectious quanta concentration $N_0$ of air output by the AHU 304 is calculated using the equations:

$$T_0 = xT_a + (1-x)\frac{\sum_k f_k T_k}{\sum_k f_k} - \Delta T_c$$

$$\omega_0 = x\omega_a + (1-x)\frac{\sum_k f_k \omega_k}{\sum_k f_k} - \Delta\omega_c$$

$$N_0 = (1-\lambda)(1-x)\frac{\sum_k f_k N_k}{\sum_k f_k}$$

where x is the fresh-air intake fraction of AHU 304, $T_a$ is current ambient temperature, $\omega_a$ is current ambient humidity, $\Delta T_c$ is temperature reductions from the cooling coil of AHU 304, $\Delta\omega_c$ is humidity reduction from the cooling coil of AHU 304, and $\lambda$ is a fractional reduction of infectious quanta due to filtration (e.g., operation of filter 308) and/or UV treatment (e.g., operation of UV lights 306) at AHU 304 (but not due to ventilation which is accounted for in the factor 1−x, according to some embodiments.

In some embodiments, the dynamic models of the individual zones are stored by and used by model manager 416. Model manager 416 can store the individual dynamic models shown above and/or aggregated models (described in greater detail below) and populate the models. The populated models can then be provided by model manager 416 to optimization manager 412 for use in performing an optimization.

In some embodiments, model manager 416 is configured to receive sensor data from sensor manager 414. Sensor manager 414 may receive sensor data from zone sensors 312 and/or ambient sensors 313 and provide appropriate or required sensor data to the various managers, modules, generators, components, etc., of memory 406. For example, sensor manager 414 can obtain values of the current ambient temperature $T_a$, the current ambient humidity $\omega_a$, the temperature reduction $\Delta T_c$ resulting from the cooling coil of AHU 304, and/or the humidity reduction $\Delta\omega_c$ resulting from the cooling coil of AHU 304, and provide these values to model manager 416 for use in determining $T_0$, $\omega_0$, and $N_0$ or for populating the dynamic models of the individual zones 206.

In some embodiments, various parameters or values of the variables of the dynamic models of the individual zones 206 are predefined, predetermined, or stored values, or may be determined (e.g., using a function, an equation, a table, a look-up table, a graph, a chart, etc.) based on sensor data (e.g., current environmental conditions of the ambient or outdoor area, environmental conditions of the zones 206, etc.). For example, the mass density of air p may be a predetermined value or may be determined based on sensor data. In some embodiments, model manager 416 can use stored values, sensor data, etc., to fully populate the dynamic models of the individual zones 206 (except for control or adjustable variables of the dynamic models of the individual zones 206 that are determined by performing the optimization). Once the models are populated so that only the control variables remain undefined or undetermined, model manager 416 can provide the populated models to optimization manager 412.

The number of infectious individuals $I_k$ can be populated based on sensor data (e.g., based on biometric data of occupants or individuals of the building zones 206), or can be estimated based on sensor data. In some embodiments, model manager 416 can use an expected number of occupants and various database regarding a number of infected individuals in an area. For example, model manager 416 can query an online database regarding potential infection spread in the area (e.g., number of positive tests of a particular virus or contagious illness) and estimate if it is likely that an infectious individual is in the building zone 206.

In some embodiments, it can be difficult to obtain zone-by-zone values of the number of infectious individuals $I_k$ in the modeled space (e.g., the zones 206). In some embodiments, model manager 416 is configured to use an overall approximation of the model for $N_k$. Model manager 416 can store and use volume-averaged variables:

$$\overline{N} = \frac{\sum_k V_k N_k}{\overline{V}}$$

$$\overline{f} = \sum_k f_k$$

$$\overline{V} = \sum_k V_k$$

$$\overline{I} = \sum_k I_k$$

according to some embodiments. Specifically, the equations shown above aggregate the variables $\overline{N}$, $\overline{f}$, $\overline{V}$, and $\overline{I}$ across multiple zones 206 by calculating a weighted average based on the volume of zones 206.

The K separate ordinary differential equation models (i.e., the dynamic models of the individual zones 206) can be added for $N_k$ to determine an aggregate quantum concentration model:

$$\overline{V}\frac{d\overline{N}}{dt} = \sum_k V_k \frac{dN_k}{dt}$$

$$= \sum_k (f_k(N_0 - N_k) + I_k q)$$

$$= \overline{I}q + \sum_k f_k \left( (1-\lambda)(1-x)\frac{\sum_{k'} f_{k'} N_{k'}}{\sum_{k'} f_{k'}} - N_k \right)$$

$$= \overline{I}q + (1-\lambda)(1-x)\sum_{k'} f_{k'} N_{k'} - \sum_k f_k N_k$$

$$= \overline{I}q - (\lambda + x - \lambda x)\sum_k f_k N_k$$

$$\approx \overline{I}q - (\lambda + x - \lambda x)\overline{f}\overline{N}$$

according to some embodiments, assuming that $N_k \approx \overline{N}$ for each zone 206. The aggregate quantum concentration model is shown below:

$$\overline{V}\frac{d\overline{N}}{dt} = \overline{I}q - (\lambda + x - \lambda x)\sum_k f_k N_k \approx \overline{I}q - (\lambda + x - \lambda x)\overline{f}\overline{N}$$

according to some embodiments.

Defining aggregate temperature, humidity, heat load, and moisture gain parameters:

$$\overline{T} = \frac{\sum_k V_k T_k}{\overline{V}}$$

$$\overline{\omega} = \frac{\sum_k V_k \omega_k}{\overline{V}}$$

$$\overline{Q}(\cdot) = \sum_k Q_k(\cdot)$$

$$\overline{W} = \sum_k w_k$$

allows the k thermal models $$\rho c V_k \left(\frac{dT_k}{dt}\right)$$

to be added:

$$\rho c V \frac{dT}{dt} = \sum_k \rho c V_k \frac{dT_k}{dt}$$

$$= \sum_k (\rho c f_k (T_0 - T_k) + Q_k(T_k))$$

$$= \sum_k Q_k(T_k) + \sum_k \rho c f_k \left( x T_a + (1-x) \frac{\sum_{k'} f_{k'} T_{k'}}{\sum_{k'} f_{k'}} - T_k - \Delta T_c \right)$$

$$= \sum_k Q_k(T_k) + (1-x) \sum_{k'} \rho c f_{k'} T_{k'} + \sum_k \rho f_k (x T_a - T_k - \Delta T_c)$$

$$= \sum_k Q_k(T_k) + \rho c \sum_k f_k (x(T_a - T_k) - \Delta T_c)$$

$$\approx \bar{Q}(T) + \rho c \bar{f}(x(T_a - T) - \Delta T_c)$$

according to some embodiments (assuming that $T_k \approx T$ for each zone 206). This yields the aggregate thermal model:

$$\rho c V \frac{dT}{dt} = \sum_k Q_k(T_k) + \rho c \sum_k f_k(x(T_a - T_k) - \Delta T_c) \approx \bar{Q}(T) + \rho c \bar{f}(x(T_a - T) - \Delta T_c)$$

according to some embodiments.

The moisture model $$\rho V_k \left( \frac{d\omega_k}{dt} \right)$$

can similarly be aggregated to yield an aggregate moisture model:

$$\rho V \frac{d\omega}{dt} = w + \rho \sum_k f_k(x(\omega_a - \omega_k) - \Delta\omega_c) \approx w + \rho \bar{f}(x(\omega_a - \omega) - \Delta\omega_c)$$

to predict an evolution of volume-averaged humidity, according to some embodiments.

In some embodiments, model manager 416 stores and uses the aggregate quantum concentration model, the aggregate thermal model, and/or the aggregate moisture model described hereinabove. Model manager 416 can populate the various parameters of the aggregate models and provide the aggregate models to optimization manager 412 for use in the optimization.

Referring still to FIG. 4, memory 406 includes optimization manager 412. Optimization manager 412 can be configured to use the models provided by model manager 416 and various constraints provided by constraint generator 410 to construct an optimization problem for HVAC system 200 (e.g., to determine design outputs and/or to determine control parameters, setpoints, control decisions, etc., for UV lights 306 and/or AHU 304). Optimization manager 412 can construct an optimization problem that uses the individual or aggregated temperature, humidity, and/or quantum concentration models subject to constraints to minimize energy use. In some embodiments, decision variables of the optimization problem formulated and solved by optimization manager 412 are the flows $f_k$ (or the aggregate $\bar{f}$ if the optimization problem uses the aggregate models), the outdoor air fraction x and the infectious quanta removal fraction $\lambda$.

The infectious quanta removal fraction A is defined as:

$$\lambda = \lambda_{filter} + \lambda_{UV}$$

where $\lambda_{filter}$ is an infectious quanta removal fraction that results from using filter 308 (e.g., an amount or fraction of infectious quanta that is removed by filter 308), and $\lambda_{UV}$ is an infectious quanta removal fraction that results from using UV lights 306 (e.g., an amount or fraction of infectious quanta that is removed by operation of UV lights 306). In some embodiments, $\lambda_{filter}$ is a design-time constant (e.g., determined based on the chosen filter 308), whereas $\lambda_{UV}$ is an adjustable or controllable variable that can be determined by optimization manager 412 by performing the optimization of the optimization problem. In some embodiments, $\lambda_{UV}$ is a discrete variable. In some embodiments, $\lambda_{UV}$ is a continuous variable.

Instantaneous electricity or energy consumption of HVAC system 200 is modeled using the equation (e.g., an objective function that is minimized):

$$E = \eta_{coil} \rho \bar{f}(c \Delta T_c + L \Delta \omega_c) + \eta_{fan} \bar{f} \Delta P + \eta_{UV} \lambda_{UV}$$

where L is a latent heat of water, $\Delta P$ is a duct pressure drop, $\eta_{coil}$ is an efficiency of the cooling coil of AHU 304, $\eta_{fan}$ is an efficiency of a fan of AHU 304, and $\eta_{UV}$ is an efficiency of the UV lights 306, according to some embodiments. In some embodiments, optimization manager 412 is configured to store and use the energy consumption model shown above for formulating and performing the optimization. In some embodiments, the term $\eta_{coil} \rho \bar{f}(c \Delta T_c + L \Delta \omega_c)$ is an amount of energy consumed by the cooling coil or heating coil of the AHU 304 (e.g., over an optimization time period or time horizon), the term $\eta_{fan} \bar{f} \Delta P$ is an amount of energy consumed by the fan of the AHU 304, and $\eta_{UV} \lambda_{UV}$ is the amount of energy consumed by the UV lights 306. In some embodiments, the duct pressure drop $\Delta P$ is affected by or related to a choice of a type of filter 308, where higher efficiency filters 308 (e.g., filters 308 that have a higher value of $\eta_{filter}$) generally resulting in a higher value of the duct pressure drop $\Delta P$ and therefore greater energy consumption. In some embodiments, a more complex model of the energy consumption is used by optimization manager 412 to formulate the optimization problem (e.g., a non-linear fan model and a time-varying or temperature-dependent coil efficiency model).

In some embodiments, the variables $\Delta T_c$ and $\Delta \omega_c$ for the cooling coil of the AHU 304 are implicit dependent decision variables. In some embodiments, a value of a supply temperature $T_{AHU}$ is selected for the AHU 304 and is used to determine the variables $\Delta T_c$ and $\Delta \omega_c$ based on inlet conditions to the AHU 304 (e.g., based on sensor data obtained by sensor manager 414). In such an implementation, model manager 416 or optimization manager 412 may determine that $T_0 = T_{AHU}$ and an equation for $\omega_0$.

Optimization manager 412 can use the models (e.g., the individual models, or the aggregated models) provided by model manager 416, and constraints provided by constraint generator 410 to construct the optimization problem. Optimization manager 412 may formulate an optimization problem to minimize energy consumption subject to constraints on the modeled parameters, $\omega$, and N and additional constraints:

$$\min_{f_t, x_t, \lambda_t} \sum_t E_t \qquad \text{(Energy Cost)}$$

s.t. ... (Dynamic Models for $T_t$, $\omega_t$, and $N_t$)

... (Infection Probability Contraint)

$T_t^{min} \leq T_t \leq T_t^{max}$ (Temperature Bounds)

$\omega_t^{min} \leq \omega_t \leq \omega_t^{max}$ (Humidity Bounds)

$x_t f_t \geq F_t^{min}$ (Fresh-Air Ventilation Bound)

$f_t^{min} \leq f_t \leq f_t^{max}$ (VAV Flow Bounds)

$0 \leq x_t \leq 1$ (Outdoor-Air Damper Bounds)

where $\Sigma_t E_t$ is the summation of instantaneous electricity or energy consumption of the HVAC system 200 over an optimization time period, subject to the dynamic models for $T_t$, $\omega_t$, and $N_t$ (either zone-by-zone individual models, or aggregated models as described above), an infection probability constraint (described in greater detail below), temperature boundary constraints ($T_t^{min} \leq T_t \leq T_t^{max}$, maintaining $T_t$ between a minimum temperature boundary $T_t^{min}$ and a maximum temperature boundary $T_t^{max}$), humidity boundary constraints ($\omega_t^{min} \leq \omega_t \leq \omega_t^{max}$, maintaining the humidity $\omega_t$ between a minimum humidity boundary $\omega_t^{min}$ and a maximum humidity boundary $\omega_t^{max}$), a fresh air ventilation boundary ($x_t f_t \geq F_t^{min}$, maintaining the fresh air ventilation $x_t f_t$ above or equal to a minimum required amount $F_t^{min}$), a VAV flow boundary ($f_t^{min} \leq f_t \leq f_t^{max}$, maintaining the volumetric flow rate $f_t$ between a minimum boundary $f_t^{min}$ and a maximum boundary $f_t^{max}$), and an outdoor air damper bound/constraint ($0 \leq x_t \leq 1$ maintaining the outdoor air fraction $x_t$ between 0 and 1). In some embodiments, optimization manager 412 is configured to discretize the dynamic models (e.g., the individual dynamic models or the aggregate dynamic models) using matrix exponentials or approximately using collocation methods.

The boundaries on temperature ($T_t^{min} \leq T_t \leq T_t^{max}$) and humidity ($\omega_t^{min} \leq \omega_t \leq \omega_t^{max}$) can be determined by optimization manager 412 based on user inputs or derived from comfort requirements. The temperature and humidity bounds may be enforced by optimization manager 412 as soft constraints. The remaining bounds (e.g., the fresh-air ventilation bound, the VAV flow bounds, and the outdoor-air damper bounds) can be applied to input quantities (e.g., decision variables) by optimization manager 412 as hard constraints for the optimization. In some embodiments, the fresh-air ventilation bound is enforced by optimization manager 412 to meet the American Society of Heating, Refrigerating, and Air-Conditioning Engineers (ASHRAE) standards. In some embodiments, the fresh-air ventilation bound is replaced with a model and corresponding bounds for CO2 concentration.

In some embodiments, the various constraints generated by constraint generator 410 or other constraints imposed on the optimization problem can be implemented as soft constraints, hard constraints, or a combination thereof. Hard constraints may impose rigid boundaries (e.g., maximum value, minimum value) on one or more variables in the optimization problem such that any feasible solution to the optimization problem must maintain the hard constrained variables within the limits defined by the hard constraints. Conversely, soft constraints may be implemented as penalties that contribute to the value of the objective function (e.g., adding to the objective function if the optimization problem seeks to minimize the objective function or subtracting from the objective function if the optimization problem seeks to maximize the objective function). Soft constraints may be violated when solving the optimization problem, but doing so will incur a penalty that affects the value of the objective function. Accordingly, soft constraints may encourage optimization manager 412 to maintain the values of the soft constrained variables within the limits defined by the soft constraints whenever possible to avoid the penalties, but may allow optimization manager 412 to violate the soft constraints when necessary or when doing so would result in a more optimal solution.

In some embodiments, constraint generator 410 may impose soft constraints on the optimization problem by defining large penalty coefficients (relative to the scale of the other terms in the objective function) so that optimization manager 412 only violates the soft constraints when absolutely necessary. However, it is contemplated that the values of the penalty coefficients can be adjusted or tuned (e.g., by a person or automatically by constraint generator 410) to provide an optimal tradeoff between maintaining the soft constrained variables within limits and the resulting cost (e.g., energy cost, monetary cost) defined by the objective function. One approach which can be used by constraint generator 410 is to use penalties proportional to amount by which the soft constraint is violated (i.e., static penalty coefficients). For example, a penalty coefficient of 0.1 $/° C.·hr for a soft constrained temperature variable would add a cost of $0.10 to the objective function for every 1° C. that the temperature variable is outside the soft constraint limit for every hour of the optimization period. Another approach which can be used by constraint generator 410 is to use variable or progressive penalty coefficients that depend on the amount by which the soft constraint is violated. For example, a variable or progressive penalty coefficient could define a penalty cost of 0.1 $/° C.·hr for the first 1° C. by which a soft constrained temperature variable is outside the defined limit, but a relatively higher penalty cost of 1.0 $/° C.·hr for any violations of the soft constrained temperature limit outside the first 1° C.

Another approach which can be used by constraint generator 410 is to provide a "constraint violation budget" for one or more of the constrained variables. The constraint violation budget may define a total (e.g., cumulative) amount by which a constrained variable is allowed to violate a defined constraint limit within a given time period. For example a constraint violation budget for a constrained temperature variable may define 30° C.·hr (or any other value) as the cumulative amount by which the constrained temperature variable is allowed to violate the temperature limit within a given time period (e.g., a day, a week, a month, etc.). This would allow the temperature to violate the temperature constraint by 30° C. for a single hour, 1° C. for each of 30 separate hours, 0.1° C. for each of 300 separate hours, 10° C. for one hour and 1° C. for each of 20 separate hours, or any other distribution of the 30° C.·hr amount across the hours of the given time period, provided that the cumulative temperature constraint violation sums to 30° C.·hr or less. As long as the cumulative constraint violation amount is within (e.g., less than or equal to) the constraint violation budget, constraint generator 410 may not add a penalty to the objective function or subtract a penalty from the objective function. However, any further violations of the constraint that exceed the constraint violation budget may trigger a penalty. The penalty can be defined using static penalty coefficients or variable/progressive penalty coefficients as discussed above.

The infection probability constraint (described in greater detail below) is linear, according to some embodiments. In some embodiments, two sources of nonlinearity in the optimization problem are the dynamic models and a calculation of the coil humidity reduction $\Delta\omega_c$. In some embodiments, the optimization problem can be solved using nonlinear programming techniques provided sufficient bounds are applied to the input variables.

Infection Probability Constraint

Referring still to FIG. 4, memory 406 is shown to include a constraint generator 410. Constraint generator 410 can be configured to generate the infection probability constraint, and provide the infection probability constraint to optimization manager 412. In some embodiments, constraint generator 410 is configured to also generate the temperature bounds, the humidity bounds, the fresh-air ventilation bound, the VAV flow bounds, and the outdoor-air damper bounds and provide these bounds to optimization manager 412 for performing the optimization.

For the infection probability constraint, the dynamic extension of the Wells-Riley equation implies that there should be an average constraint over a time interval during which an individual is in the building. An individual i's probability of infection $P_{i,[0,T]}$ over a time interval [0, T] is given by:

$$P_{i,[0,T]} = 1 - \exp\left(-p\Delta \sum_t \delta_{it} N_t\right),$$

$$\delta_{it} = \begin{cases} 1 & \text{if } i \text{ present at time } t \\ 0 & \text{else} \end{cases}$$

according to some embodiments. Assuming that the individual's probability of infection $P_{i,[0,T]}$ is a known value, an upper bound $P^{max}$ can be chosen for $P_{i,[0,T]}$ and can be implemented as a linear constraint:

$$\sum_t \delta_{it} N_t \leq -\frac{1}{p\Delta} \log(1 - P^{max})$$

according to some embodiments. In some embodiments, the variable $\delta_{it}$ may be different for each individual in the building 10 but can be approximated as described herein.

The above linear constraint is an average constraint that gives optimization manager 412 (e.g., an optimizer) a maximum amount of flexibility since the average constraint may allow a higher concentration of infectious quanta during certain times of the day (e.g., when extra fresh-air ventilation is expensive due to outdoor ambient conditions) as long as the higher concentrations are balanced by lower concentrations of the infectious quanta during other times of the day. However, the $\delta_{it}$ sequence may be different for each individual in the building 10. For purposes of the example described herein it is assumed that generally each individual is present a total of 8 hours (e.g., if the building 10 is an office building). However, the estimated amount of time the individual is within the building can be adjusted or set to other values for other types of buildings. For example, when the systems and methods described herein are implemented in a restaurant or store, the amount of time the individual is assumed to be present in the building can be set to an average or estimated amount of time required to complete the corresponding activities (e.g., eating a meal, shopping, etc.). While an occupancy time of the building by each individual may be reasonably known, the times that the individual is present in the building may vary (e.g., the individual may be present from 7 AM to 3 PM, 9 AM to 5 PM, etc.). Therefore, to ensure that the constraint is satisfied for all possible $\delta_{it}$ sequences, the constraint may be required to be satisfied when summing over 8 hours of the day that have a highest concentration.

This constraint is represented using linear constraints as:

$$M\eta + \sum_t \mu_t \leq -\frac{1}{p\Delta} \log(1 - P^{max})$$

$$\mu_t + \eta \geq N_t \quad \forall t$$

where $\eta$ and $\mu_t$ are new auxiliary variables in the optimization problem, and M is a number of discrete timesteps corresponding to 8 hours (or any other amount of time that an individual is expected to occupy building 10 or one of building zones 206). This formulation may work since $\eta$ is set to an Mth highest value of $N_t$ and each of the $\mu_t$ satisfy $\mu_t = \max(N_t - \eta, 0)$. Advantageously, this implementation of the infection probability constraint can be generated by constraint generator 410 and provided to optimization manager 412 for use in the optimization problem when controller 310 is implemented to perform control decisions for HVAC system 200 (e.g., when controller 310 operates in an on-line mode).

An alternative implementation of the infection probability constraint is shown below that uses a pointwise constraint:

$$N_t \leq N_t^{max} = -\frac{1}{Mp\Delta} \log(1 - P^{max})$$

where $N_t$ is constrained to be less than or equal to $N_t^{max}$ for a maximum infection probability value $P^{max}$. In some embodiments, the pointwise constraint shown above is generated by constraint generator 410 for when optimization manager 412 is used in an off-line or design implementation. In some embodiments, the pointwise constraint shown above, if satisfied in all zones 206, ensures that any individual will meet the infection probability constraint. Such a constraint may sacrifice flexibility compared to the other implementation of the infection probability constraint described herein, but translates to a simple box constraint similar to the other bounds in the optimization problem, thereby facilitating a simpler optimization process.

In some embodiments, the maximum allowable or desirable infection probability $P^{max}$ is a predetermined value that is used by constraint generator 410 to generate the infection probability constraints described herein. In some embodiments, constraint generator 410 is configured to receive the maximum allowable or desirable infection probability P' from a user as a user input. In some embodiments, the maximum allowable or desirable infection probability $P^{max}$ is an adjustable parameter that can be set by a user or automatically generated based on the type of infection, time of year, type or use of the building, or any of a variety of other factors. For example, some buildings (e.g., hospitals) may be more sensitive to preventing disease spread than other types of buildings and may use lower values of $P^{max}$. Similarly, some types of diseases may be more serious or life-threatening than others and therefore the value of $P^{max}$ can be set to relatively lower values as the severity of the disease increases. In some embodiments, the value of $P^{max}$ can be adjusted by a user and the systems and methods described herein can run a plurality of simulations or optimizations for a variety of different values of P to determine the impact on cost and disease spread. A user can select the desired value of $P^{max}$ in view of the estimated cost and impact on disease spread using the results of the simulations or optimizations.

Model Enhancements

Referring still to FIG. 4, optimization manager 412, constraint generator 410, and/or model manager 416 can implement various model enhancements in the optimization. In some embodiments, optimization manager 412 is configured to add a decision variable for auxiliary (e.g., controlled) heating (e.g., via baseboard heat or VAV reheat coils). In some embodiments, an effect of the auxiliary heating is included in the dynamic model of temperature similar to the disturbance heat load $Q_k(\cdot)$. Similar to the other decision variables, the auxiliary heating decision variable may be subject to bounds (e.g., with both set to zero during cooling season to disable auxiliary heating) that are generated by constraint generator 410 and used by optimization manager 412 in the optimization problem formulation and solving. In some embodiments, the auxiliary heating also results in optimization manager 412 including another term for associated energy consumption in the energy consumption equation (shown above) that is minimized.

In some embodiments, certain regions or areas may have variable electricity prices and/or peak demand charges. In some embodiments, the objective function (e.g., the energy consumption equation) can be augmented by optimization manager 412 to account for such cost structures. For example, the existing energy consumption $E_t$ that is minimized by optimization manager 412 may be multiplied by a corresponding electricity price $P_t$. A peak demand charge may require the use of an additional parameter $e_t$ that represents a base electric load of building 10 (e.g., for non-HVAC purposes). Optimization manager 412 can include such cost structures and may minimize overall cost associated with electricity consumption rather than merely minimizing electrical consumption. In some embodiments, optimization manager 412 accounts for revenue which can be generated by participating in incentive based demand response (IBDR) programs, frequency regulation (FR) programs, economic load demand response (ELDR) programs, or other sources of revenue when generating the objective function. In some embodiments, optimization manager 412 accounts for the time value of money by discounting future costs or future gains to their net present value. These and other factors which can be considered by optimization manager 412 are described in detail in U.S. Pat. No. 10,359, 748 granted Jul. 23, 2019, U.S. Patent Application Publication No. 2019/0347622 published Nov. 14, 2019, and U.S. Patent Application Publication No. 2018/0357577 published Dec. 13, 2018, each of which is incorporated by reference herein in its entirety.

In some embodiments, certain locations have time-varying electricity pricing, and therefore there exists a potential to significantly reduce cooling costs by using a solid mass of building 10 for thermal energy storage. In some embodiments, controller 310 can operate to pre-cool the solid mass of building 10 when electricity is cheap so that the solid mass can later provide passive cooling later in the day when electricity is less expensive. In some embodiments, optimization manager 412 and/or model manager 416 are configured to model this effect using a model augmentation by adding a new variable $T_k^m$ to represent the solid mass of the zone 206 evolving as:

$$\rho c_m V_k^m \frac{dT_k^m}{dt} = h_k^m(T_k - T_k^m)$$

with a corresponding term:

$$\rho c V_k \frac{dT_k}{dt} = \ldots + h_k^m(T_k^m - T_k)$$

added to the air temperature model (shown above). This quantity can also be aggregated by model manager 416 to an average value $T^m$ similar to T.

For some diseases, infectious particles may naturally become deactivated or otherwise removed from the air over time. To consider these effects, controller 310 can add a proportional decay term to the infectious quanta model (in addition to the other terms of the infectious quanta model discussed above). An example is shown in the following equation:

$$V \frac{dN}{dt} = \ldots - V\beta N$$

where $\beta$ represents the natural decay rate (in $s^{-1}$) of the infectious species and the ellipsis represents the other terms of the infectious quanta model as discussed above. Because the natural decay subtracts from the total amount of infectious particles, the natural decay term is subtracted from the other terms in the infectious quanta model. For example, if a given infectious agent has a half-life $t_{1/2}$ of one hour (i.e., $t_{1/2}$=1 hr=3600 s), then the corresponding decay rate is given by:

$$\beta = \frac{\ln(2)}{t_{1/2}} \approx 1.925 \times 10^{-4} s^{-1}$$

This extra term can ensure that infectious particle concentrations do not accumulate indefinitely over extremely long periods of time.

Off-Line Optimization

Figure 5:
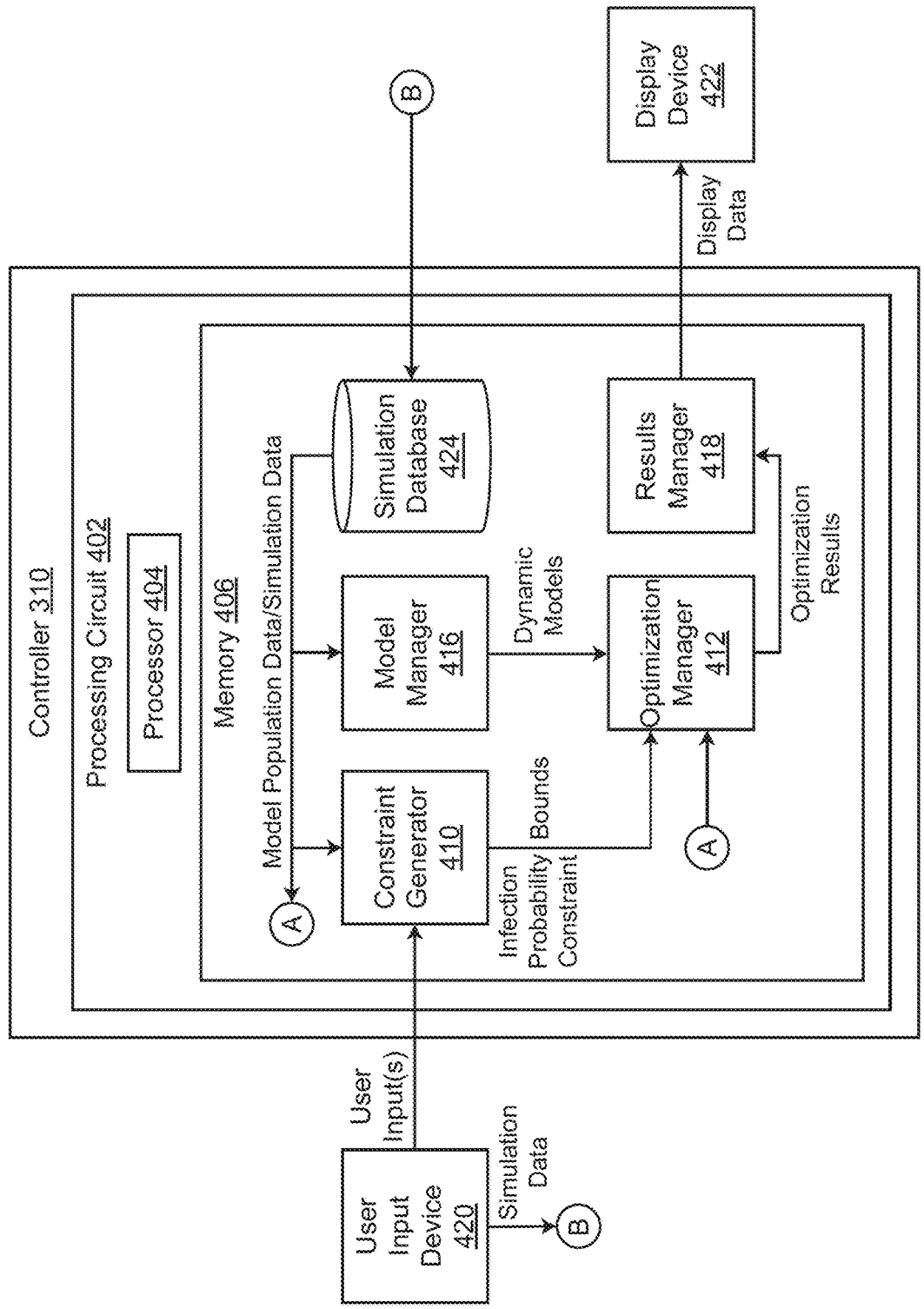
FIG. 5 is a block diagram illustrating the controller of FIG. 3 in greater detail, showing operations performed when the controller is used in an off-line or planning mode for making design suggestions to minimize energy consumption of the HVAC system and provide sufficient disinfection, according to some embodiments.

Referring particularly to FIG. 5, controller 310 can be configured for use as a design or planning tool for determining various design parameters of HVAC system 300 (e.g., for determining a size of filter 308, UV lights 306, etc.). In some embodiments, controller 310 implemented as a design tool, a planning tool, a recommendation tool, etc., (e.g., in an off-line mode) functions similarly to controller 310 implemented as a real-time control device (e.g., in an on-line mode). However, model manager 416, constraint generator 410, and optimization manager 412 may receive required sensor input data (i.e., model population data) from a simulation database 424. Simulation database 424 can store values of the various parameters of the constraints or boundaries, the dynamic models, or typical energy consumption costs or operational parameters for energy-consuming devices of the HVAC system 200. In some embodiments, simulation database 424 also stores predicted or historical values as obtained from sensors of HVAC system 200. For example, simulation database 424 can store typical ambient temperature, humidity, etc., conditions for use in performing the off-line simulation.

When controller 310 is configured for use as the design tool (shown in FIG. 5), controller 310 may receive user inputs from user input device 420. The user inputs may be initial inputs for various constraints (e.g., a maximum value of the probability of infection for the simulation) or various required input parameters. The user can also provide simulation data for simulation database 424 used to populate the models or constraints, etc. Controller 310 can output suggestions of whether to use a particular piece of equipment (e.g., whether or not to use or install UV lights 306), whether to use AHU 304 to draw outside air, etc., or other factors to minimize cost (e.g., to optimize the objective function, minimize energy consumption, minimize energy consumption monetary cost, etc.) and to meet disinfection goals (e.g., to provide a desired level of infection probability). In some embodiments, controller 310 may provide different recommendations or suggestions based on a location of building 10. In some embodiments, the recommendations notify the user regarding what equipment is needed to keep the infection probability of zones 206 within the threshold while not increasing energy cost or carbon footprint.

Compared to the on-line optimization (described in greater detail below), the optimization problem formulated by optimization manager 412 for the off-line implementation includes an additional constraint on the infectious quanta concentration (as described in greater detail above). In some embodiments, the infectious quanta concentration can be controlled or adjusted by (a) changing the airflow into each zone 206 (e.g., adjusting $f_i$), (b) changing the fresh-air intake fraction (e.g., adjusting x), or (c) destroying infectious particles in the AHU 304 via filtration or UV light (e.g., adjusting $\lambda$).

It should be noted that the first and second control or adjustments (e.g., (a) and (b)) may also affect temperature and humidity of the zones 206 of building 10. However, the third control option (c) (e.g., adjusting the infectious quanta concentration through filtration and/or operation of UV lights) is independent of the temperature and humidity of the zones 206 of building 10 (e.g., does not affect the temperature or humidity of zones 206 of building 10). In some embodiments, optimization manager 412 may determine results that rely heavily or completely on maintaining the infectious quanta concentration below its corresponding threshold or bound through operation of filter 308 and/or UV lights 306. However, there may be sufficient flexibility in the temperature and humidity of building zone 206 so that optimization manager 412 can determine adjustments to (a), (b), and (c) simultaneously to achieve lowest or minimal operating costs (e.g., energy consumption). Additionally, since purchasing filters 308 and/or UV lights 306 may incur significant capital costs (e.g., to purchase such devices), controller 310 may perform the optimization as a simulation to determine if purchasing filters 308 and/or UV lights 306 is cost effective.

When controller 310 is configured as the design tool shown in FIG. 5, controller 310 may provide an estimate of a total cost (both capital costs and operating costs) to achieve a desired level of infection control (e.g., to maintain the infection probability below or at a desired amount). The purpose is to run a series of independent simulations, assuming different equipment configurations (e.g., as stored and provided by simulation database 424) and for different infection probability constraints given typical climate and occupancy data (e.g., as stored and provided by simulation database 424). In some embodiments, the different equipment configurations include scenarios when filters 308 and/or UV lights 306 are installed in the HVAC system 200, or when filters 308 and/or UV lights 306 are not installed in the HVAC system 200.

After performing the simulation for different equipment configuration scenarios and/or different infection probability constraints, controller 310 can perform a cost benefit analysis based on global design decisions (e.g., whether or not to install UV lights 306 and/or filters 308). The cost benefit analysis may be performed by results manager 418 and the cost benefit analysis results can be output as display data to a building manager via display device 422. These results may aid the building manager or a building designer in assessing potential options for infection control of building 10 (as shown in FIG. 8).

Figure 8:
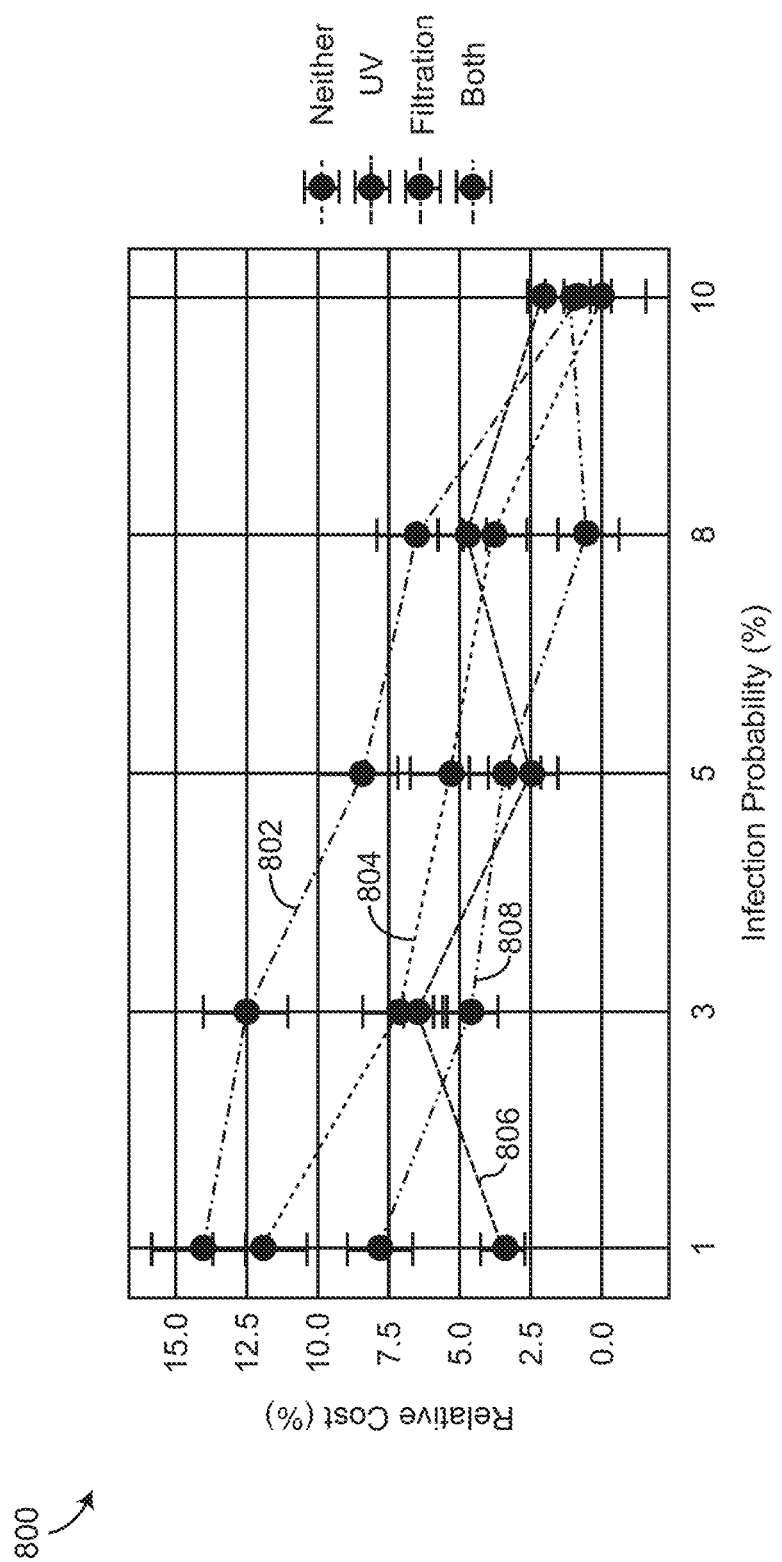
FIG. 8 is a graph of various design suggestions or information that can be provided by the controller of FIG. 3, according to some embodiments.

Referring particularly to FIGS. 5 and 8, graph 800 illustrates a potential output of results manager 418 that can be displayed by display device 422. Graph 800 illustrates relative cost (the Y-axis) with respect to infection probability (the X-axis) for a case when both filtration and UV lights are used for infection control (represented by series 808), a case when filtration is used for infection control without using UV lights (represented by series 802), a case when UV lights are used for infection control without using filtration (represented by series 806), and a case when neither UV lights and filtration are used for infection control (represented by series 804). In some embodiments, each of the cases illustrated by series 802-808 assume that fresh-air intake is used to control infection probability. Data associated with graph 800 can be output by results manager 418 so that graph 800 can be generated and displayed on display device 422.

In some embodiments, the off-line optimization performed by optimization manager 412 is faster or more computationally efficient than the on-line optimization performed by optimization manager 412. In some embodiments, the simulation is performed using conventional rule-based control rather than a model-predictive control scheme used for the on-line optimization. Additionally, the simulation may be performed over shorter time horizons than when the optimization is performed in the on-line mode to facilitate simulation of a wide variety of design conditions.

In some embodiments, optimization manager 412 is configured to use the aggregate dynamic models as generated, populated, and provided by model manager 416 for the off-line optimization (e.g., the design optimization). When optimization manager 412 uses the aggregate dynamic models, this implies that there are three decision variables of the optimization: $\bar{f}$, x, and $\lambda$. The variable $\lambda$ can include two positions at each timestep (e.g., corresponding to the UV lights 306 being on or the UV lights 306 being off). A reasonable grid size of $\bar{f}$ and x may be 100. Accordingly, this leads to 100×100×2=20,000 possible combinations of control decisions at each step, which is computationally manageable. Therefore, optimization manager 412 can select values of the variables $\bar{f}$, x, and $\lambda$ via a one-step restriction of the optimization problem by simply evaluating all possible sets of control inputs and selecting the set of control inputs that achieves a lowest cost.

If additional variables are used, such as an auxiliary heating variable, this may increase the dimensionality of the optimization problem. However, optimization manager 412 can select a coarser grid (e.g., 5 to 10 choices) for the additional variable.

In some embodiments, optimization manager 412 is configured to solve a number of one-step optimization problems (e.g., formulate different optimization problems for different sets of the control variables and solve the optimization problem over a single timestep) in a training period, and then train a function approximator (e.g., a neural network) to recreate a mapping. This can improve an efficiency of the optimization. In some embodiments, optimization manager 412 is configured to apply a direct policy optimization to the dynamic models in order to directly learn a control law using multiple parallel optimization problems.

In some embodiments, when controller 310 functions as the design tool shown in FIG. 5, there are two design variables. The first design variable is whether it is cost effective or desirable to purchase and install UV lights 306, and the second design variable is whether it is cost effective or desirable to purchase and install filters 308 (e.g., advanced filtration devices).

In some embodiments, optimization manager 412 is configured to perform a variety of simulations subject to different simulation variables for each simulation month. These simulation variables can be separated into a design decision category and a random parameter category. The design decision category includes variables whose values are chosen by system designers, according to some embodiments. The random parameters category includes variables whose values are generated by external (e.g., random) processes.

The design decision category can include a first variable of whether to activate UV lights 306. The first variable may have two values (e.g., a first value for when UV lights 306 are activated and a second value for when UV lights 306 are deactivated). The design decision category can include a second decision variable of which of a variety of high-efficiency filters to use, if any. The second variable may have any number of values that the building manager wishes to simulate (e.g., 5) and can be provided via user input device 420. The design decisions category can also include a third variable of what value should be used for the infection probability constraint (as provided by constraint generator 410 and used in the optimization problem by optimization manager 412). In some embodiments, various values of the third variable are also provided by the user input device 420. In some embodiments, various values of the third variable are predetermined or stored in simulation database 424 and provided to optimization manager 412 for use in the simulation. The third variable may have any number of values as desired by the user (e.g., 3 values).

The random parameters category can include an ambient weather and zone occupancy variable and a number of infected individuals that are present in building 10 variable. In some embodiments, the ambient weather and zone occupancy variable can have approximately 10 different values. In some embodiments, the number of infected individuals present can have approximately 5 different values.

In order to determine a lowest cost for a given month, optimization manager 412 can aggregate the variables in the random parameters category (e.g., average) and then perform an optimization to minimize the energy consumption or cost over feasible values of the variables of the design decisions category. In some embodiments, some of the design-decision scenarios are restricted by a choice of global design decisions. For example, for optimization manager 412 to calculate monthly operating costs assuming UV lights 306 are chosen to be installed but not filtration, optimization manager 412 may determine that a lowest cost scenario across all scenarios is with no filtration but with the UV lights 306 enabled or disabled. While this may be unusual (e.g., for the UV lights 306 to be disabled) even though the UV lights 306 are installed, various conditions (e.g., such as weather) may make this the most cost effective solution.

In some embodiments, simulation logic performed by optimization manager 412 may be performed in a Tensorflow (e.g., as operated by a laptop computer, or any other sufficiently computationally powerful processing device). In order to perform 1,500 simulation scenarios for each month, or 18,000 for an entire year, with a timestep of 15 minutes, this implies a total of approximately 52 million timesteps of scenarios for a given simulation year.

In some embodiments, optimization manager 412 requires various simulation data in order to perform the off-line simulation (e.g., to determine the design parameters). In some embodiments, the simulation data is stored in simulation database 424 and provided to any of constraint generator 410, model manager 416, and/or optimization manager 412 as required to perform their respective functions. The simulation data stored in simulation database 424 can include heat-transfer parameters for each zone 206, thermal and moisture loads for each zone 206, coil model parameters of the AHU 304, fan model parameters of the AHU 304, external temperature, humidity, and solar data, filtration efficiency, pressure drop, and cost versus types of the filter 308, disinfection fraction and energy consumption of the UV lights 306, installation costs for the UV lights 306 and the filter 308, typical breathing rate p, a number of infected individuals T in building zones 206, and disease quanta generation q values for various diseases. In some embodiments, the heat-transfer parameters for each zone 206 may be obtained by simulation database 424 from previous simulations or from user input device 420. In some embodiments, the thermal and moisture loads for each zone 206 are estimated based on an occupancy of the zones 206 and ASHRAE guidelines. After this simulation data is obtained in simulation database 424, controller 310 may perform the simulation (e.g., the off-line optimization) as described herein.

It should be understood that as used throughout this disclosure, the term "optimization" may signify a temporal optimization (e.g., across a time horizon) or a static optimization (e.g., at a particular moment in time, an instantaneous optimization). In some embodiments, optimization manager 412 is configured to either run multiple optimizations for different equipment selections, or is configured to treat equipment configurations as decision variables and perform a single optimization to determine optimal equipment configurations.

It should also be understood that the term "design" as used throughout this disclosure (e.g., "design data" and/or "design tool") may include equipment recommendations (e.g., recommendations to purchase particular equipment or a particular type of equipment such as a particular filter) and/or operational recommendations for HVAC system 200. In other words, "design data" as used herein may refer to any information, metrics, operational data, guidance, suggestion, etc., for selecting equipment, an operating strategy, or any other options to improve financial metrics or other control objectives (e.g., comfort and/or infection probability).

For example, controller 310 as described in detail herein with reference to FIG. 5 may be configured to provide recommendations of specific models to purchase. In some embodiments, controller 310 is configured to communicate with an equipment performance database to provide product-specific selections. For example, controller 310 can search the database for equipment that has particular specifications as determined or selected by the optimization. In some embodiments, controller 310 may also provide recommended or suggested control algorithms (e.g., model predictive control) as the design data. In some embodiments, controller 310 may provide a recommendation or suggestion of a general type of equipment or a general equipment configuration without specifying a particular model. In some embodiments, controller 310 may also recommend a specific filter or a specific filter rating. For example, optimization manager 412 can perform multiple optimizations with different filter ratings and select the filter ratings associated with an optimal result.

On-Line Optimization

Referring again to FIG. 4, controller 310 can be implemented as an on-line controller that is configured to determine optimal control for the equipment of building 10. Specifically, controller 310 may determine optimal operation for UV lights 306 and AHU 304 to minimize energy consumption after UV lights 306 and/or filter 308 are installed and HVAC system 200 is operational. When controller 310 is configured as an on-line controller, controller 310 may function similarly to controller 310 as configured for off-line optimization and described in greater detail above with reference to FIG. 5. However, controller 310 can determine optimal control decisions for the particular equipment configuration of building 10.

In some embodiments, optimization manager 412 is configured to perform model predictive control similar to the techniques described in U.S. patent application Ser. No. 15/473,496, filed Mar. 29, 2017, the entire disclosure of which is incorporated by reference herein.

While optimization manager 412 can construct and optimize the optimization problem described in greater detail above, and shown below, using MPC techniques, a major difference is that optimization manager 412 performs the optimization with an infectious quanta concentration model as described in greater detail above.

$$\min_{f_t, x_t, \lambda_t} \sum_t E_t \quad \text{(Energy Cost)}$$

s.t. ... (Dynamic Models for $T_t$, $\omega_t$, and $N_t$)

... (Infection Probability Constraint)

$T_t^{min} \leq T_t \leq T_t^{max}$ (Temperature Bounds)

$\omega_t^{min} \leq \omega_t \leq \omega_t^{max}$ (Humidity Bounds)

$x_t f_t \geq F_t^{min}$ (Fresh-Air Ventilation Bound)

$f_t^{min} \leq f_t \leq f_t^{max}$ (VAV Flow Bounds)

$0 \leq x_t \leq 1$ (Outdoor-Air Damper Bounds)

Therefore, the resulting optimization problem has additional constraints on this new variable (the infectious quanta concentration) but also new flexibility by determined decisions for activating UV lights 306. In some embodiments, the optimization performed by optimization manager 412 can balance, in real time, a tradeoff between takin gin additional outdoor air (which generally incurs a cooling energy penalty) and activating the UV lights 306 (which requires electricity consumption). Additionally, the addition of infectious agent control can also provide additional room optimization of HVAC system 200 during a heating season (e.g., during winter). Without considering infectious quanta concentrations, solutions generally lead to a minimum outdoor airflow below a certain break-even temperature, below which heating is required throughout building 10. However, since the optimization problem formulated by optimization manager 412 can determine to increase outdoor air intake, this can provide an additional benefit of disinfection.

For purposes of real-time or on-line optimization, the HVAC system 200 can be modeled on a zone-by-zone basis due to zones 206 each having separate temperature controllers and VAV boxes. In some embodiments, zone-by-zone temperature measurements are obtained by controller 310 from zone sensors 312 (e.g., a collection of temperature, humidity, CO2, air quality, etc., sensors that are positioned at each of the multiple zones 206). In some embodiments, optimization manager 412 is configured to use zone-level temperature models but aggregate humidity and infectious quanta models for on-line optimization. Advantageously, this can reduce a necessary modeling effort and a number of decision variables in the optimization problem. In some embodiments, if the AHU 304 serves an excessive number of zones 206, the zone-level thermal modeling may be too computationally challenging so optimization manager 412 can use aggregate temperature models.

After optimization manager 412 has selected whether to use individual or aggregate models (or some combination thereof), optimization manager 412 can implement a constraint in the form:

$$\frac{dx}{dt} = f(x(t), u(t), p(t)) \text{ for all } t \in [0, T]$$

given a horizon t, where u(t) is a decision, control, or adjustable variable, and p(t) are time-varying parameters (the values of which are forecasted ahead of time). In some embodiments, optimization manager 412 is configured to implement such a constraint by discretizing the u(t) and p(t) signals into piecewise-constant values $u_n$ and $p_n$ where the discrete index n represents the time interval t∈[nΔ, (n+1)Δ] for a fixed sample time Δ. Optimization manager 412 may then transform the constraint to:

$$\frac{dx}{dt} = f(x(t), u_j, p_j) \text{ for all}$$

$$t \in [n\Delta, (n+1)\Delta] \text{ and } n \in \{0, \ldots, N-1\}$$

where N=T/Δ the total number of timesteps. In some embodiments, optimization manager 412 is configured to evaluate this constraint using advanced quadrature techniques. For example, optimization manager 412 may transform the constraint to:

$$x_{n+1} = F(x_n, u_n, p_n)$$

where x(t) is discretized to $x_n$ and F(•) represents a numerical quadrature routine. In some embodiments, if the models provided by model manager 416 are sufficiently simple, optimization manager 412 can derive an analytical expression for F(•) to perform this calculation directly.

In some embodiments, optimization manager 412 uses an approximate midpoint method to derive the analytical expression:

$$x_{n+1} = x_k + f\left(\frac{x_{n+1} + x_n}{2}, u_n, p_n\right)\Delta$$

where the ordinary differential equation f(•) is evaluated at a midpoint of the time interval.

In some embodiments, optimization manager 412 is configured to repeatedly solve the optimization problem at regular intervals (e.g., every hour) to revise an optimized sequence of inputs for control signal generator 408. However, since the optimization is nonlinear and nonconvex, it may be advantageous to decrease a frequency at which the optimization problem is solved to provide additional time to retry failed solutions.

In some embodiments, optimization manager 412 uses a daily advisory capacity. For example, optimization manager 412 may construct and solve the optimization problem once per day (e.g., in the morning) to determine optimal damper positions (e.g., of AHU 304), UV utilizations (e.g., operation of UV lights 306), and zone-level airflows. Using the results of this optimization, optimization manager 412 may be configured to pre-schedule time-varying upper and lower bounds on the various variables of the optimized solution, but with a range above and below so that optimization manager 412 can have sufficient flexibility to reject local disturbances. In some embodiments, regulatory control systems of HVAC system 200 are maintained but may saturate at new tighter bounds obtained from the optimization problem. However, optimization manager 412 may be configured to re-optimize during a middle of the day if ambient sensor data from ambient sensors 314 (e.g., ambient temperature, outdoor temperature, outdoor humidity, etc.) and/or weather forecasts and/or occupancy forecasts indicate that the optimization should be re-performed (e.g., if the weather forecasts are incorrect or change).

In some embodiments, optimization manager 412 is configured to reduce an amount of optimization by training a neural network based on results of multiple offline optimal solutions (e.g., determined by controller 310 when performing off-line optimizations). In some embodiments, the neural network is trained to learn a mapping between initial states and disturbance forecasts to optimal control decisions. The neural network can be used in the online implementation of controller 310 as a substitute for solving the optimization problem. One advantage of using a neural network is that the neural network evaluation is faster than performing an optimization problem, and the neural network is unlikely to suggest poor-quality local optima (provided such solutions are excluded from the training data). The neural network may, however, return nonsensical values for disturbance sequences. However, this downside may be mitigated by configuring controller 310 to use a hybrid trust-region strategy in which optimization manager 412 solves the optimization problem via direct optimization at a beginning of the day, and then for the remainder of the day, controller 310 uses neural-network suggestions if they are within a predefined trust region of the optimal solution. If a neural-network suggestion is outside of the predefined trust region, optimization manager 412 may use a previous optimal solution that is within the predefined trust region.

In some embodiments, the optimization problem is formulated by optimization manager 412 assuming the zone-level VAV flows $f_k$ are the decision variables. In some systems, however, a main interface between controller 310 and equipment of HVAC system 200 is temperature setpoints that are sent to zone-level thermostats. In some embodiments, optimization manager 412 and control signal generator 408 are configured to shift a predicted optimal temperature sequence backward by one time interval and then pass these values (e.g., results of the optimization) as the temperature setpoint. For example, if the forecasts over-estimate head loads in a particular zone 206, then a VAV damper for that zone will deliver less airflow to the zone 206, since less cooling is required to maintain a desired temperature.

When optimization manager 412 uses the constraint on infectious quanta concentration, controller 310 can now use the zone-level airflow to control two variables, while the local controllers are only aware of one. Therefore, in a hypothetical scenario, the reduced airflow may result in a violation of the constraint on infection probability. In some embodiments, optimization manager 412 and/or control signal generator 408 are configured to maintain a higher flow rate at the VAV even though the resulting temperature may be lower than predicted. To address this situation, optimization manager 412 may use the minimum and maximum bounds on the zone-level VAV dampers, specifically setting them to a more narrow range so that the VAV dampers are forced to deliver (at least approximately) an optimized level of air circulation. In some embodiments, to meet the infectious quanta concentration, the relevant bound is the lower flow limit (as any higher flow will still satisfy the constraint, albeit at higher energy cost). In some embodiments, a suitable strategy is to set the VAV minimum position at the level that delivers 75% to 90% of the optimized flow. In some embodiments, a VAV controller is free to dip slightly below the optimized level when optimization manager 412 over-estimates heat loads, while also having the full flexibility to increase flow as necessary when optimization manager 412 under-estimates heat loads. In the former case, optimization manager 412 may slightly violate the infectious quanta constraint (which could potentially be mitigated via rule-based logic to activate UV lights 306 if flow drops below planned levels), while in the latter case, the optimal solution still satisfies the constraint on infectious quanta. Thus, optimization manager 412 can achieve both control goals without significant disruption to the low-level regulatory controls already in place.

On-Line Optimization Process

Figure 6:
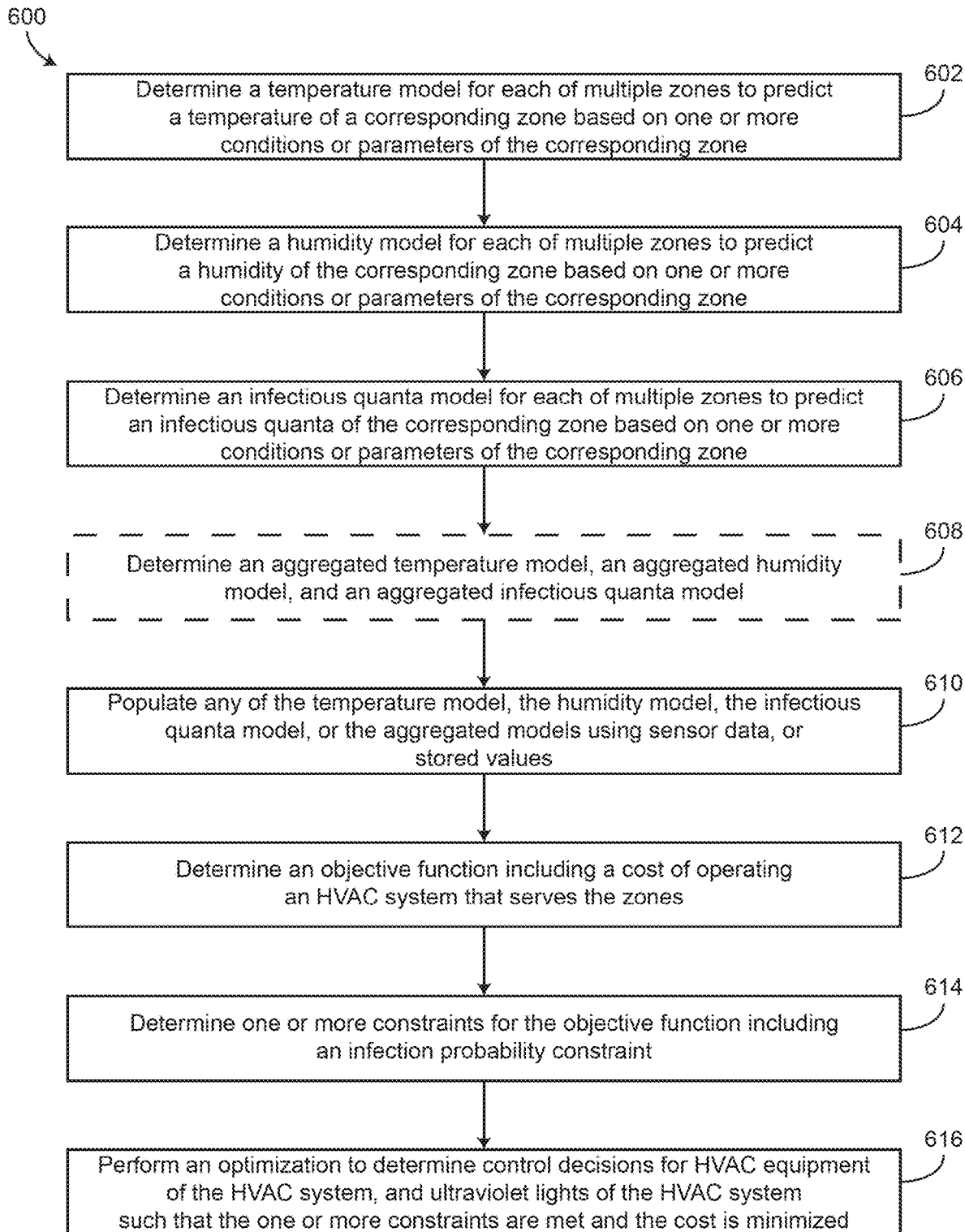
FIG. 6 is a flow diagram of a process which can be performed by the controller of FIG. 3 for determining control decisions for an HVAC system to minimize energy consumption and provide sufficient disinfection, according to some embodiments.

Referring particularly to FIG. 6, a process 600 for performing an on-line optimization to minimize energy consumption and satisfy an infection probability constraint in a building is shown, according to some embodiments. Process 600 can be performed by controller 310 when controller 310 is configured to perform an on-line optimization. In some embodiments, process 600 is performed in real time for HVAC system 200 to determine optimal control of AHU 304 and/or UV lights 306. Process 600 can be performed for an HVAC system that includes UV lights 306 configured to provide disinfection for supply air that is provided to one or more zones 206 of a building 10, filter 308 that filters an air output of an AHU, and/or an AHU (e.g., AHU 304). Process 600 can also be performed for HVAC systems that do not include filter 308 and/or UV lights 306.

Process 600 includes determining a temperature model for each of multiple zones to predict a temperature of a corresponding zone based on one or more conditions or parameters of the corresponding zone (step 602), according to some embodiments. The temperature model can be generated or determined by model manager 416 for use in an optimization problem. In some embodiments, the temperature model is:

$$\rho c V_k \left( \frac{dT_k}{dt} \right) = \rho c f_k (T_0 - T_k) + Q_k(T_k)$$

where $\rho$ is a mass density of air, c is a heat capacity of air, $V_k$ is a volume of the kth zone, $f_k$ is a volumetric flow of air into the kth zone, $T_0$ is the temperature of air output by the AHU, $T_k$ is the temperature of the kth zone, and $Q_k$ is the heat load on the kth zone. Step 602 can be performed by model manager 416 as described in greater detail above with reference to FIGS. 4-5.

Process 600 includes determining a humidity model for each of the multiple zones to predict a humidity of the corresponding zone based on one or more conditions or parameters of the corresponding zone (step 604), according to some embodiments. Step 604 can be similar to step 602 but for the humidity model instead of the temperature model. In some embodiments, the humidity model is:

$$\rho V_k \left( \frac{d\omega_k}{dt} \right) = \rho f(\omega_0 - T_0) + w_k$$

for a kth zone 206. In some embodiments, step 604 is performed by model manager 416 as described in greater detail above with reference to FIGS. 4-5.

Process 600 includes determining an infectious quanta concentration model for each of the multiple zones to predict an infectious quanta of the corresponding zone based on one or more conditions or parameters of the corresponding zone (step 606), according to some embodiments. In some embodiments, the infectious quanta concentration model is similar to the humidity model of step 604 or the temperature model of step 602. The infectious quanta concentration model can be:

$$V_k \left( \frac{dN_k}{dt} \right) = f_k(N_0 - N_k) + I_k q$$

according to some embodiments. In some embodiments, step 606 is performed by model manager 416.

Process 600 includes determining an aggregated temperature model, an aggregated humidity model, an aggregated infectious quanta model, an aggregated thermal model, and an aggregated moisture model (step 608), according to some embodiments. In some embodiments, step 608 is optional. Step 608 can include generating or determining each of the aggregated models by determining a volume-average across zones 206. The aggregate infectious quanta model is:

$$\overline{V} \frac{d\overline{N}}{dt} = \overline{I}q - (\lambda + x - \lambda x) \sum_k f_k N_k \approx \overline{I}q - (\lambda + x - \lambda x)\overline{f}\overline{N}$$

according to some embodiments. The aggregated thermal model is:

$$\rho c \overline{V} \frac{d\overline{T}}{dt} = \sum_k Q_k(T_k) + \rho c \sum_k f_k(x(T_a - T_k) - \Delta T_c) \approx \overline{Q}(\overline{T}) + \rho c \overline{f}(x(T_a - \overline{T}) - \Delta T_c)$$

according to some embodiments. The aggregated moisture model is:

$$\rho \overline{V} \frac{d\overline{\omega}}{dt} = \overline{w} + \rho \sum_k f_k(x(\omega_a - \omega_k) - \Delta \omega_c)$$

$$\approx \overline{w} + \rho \overline{f}(x(\omega_a - \overline{\omega}) - \Delta \omega_c)$$

according to some embodiments. In some embodiments, the aggregated thermal and moisture models are aggregate thermal models. Step 608 can be optional. Step 608 can be performed by model manager 416.

Process 600 includes populating any of the temperature model, the humidity model, the infectious quanta model, or the aggregated models using sensor data or stored values (step 610), according to some embodiments. In some embodiments, step 610 is performed by model manager 416. In some embodiments, step 610 is optional. Step 610 can be performed based on sensor data obtained from zone sensors 312.

Process 600 includes determining an objective function including a cost of operating an HVAC system that serves the zones (step 612), according to some embodiments. In some embodiments, step 612 is performed by optimization manager 412 using the dynamic models and/or the aggregated models provided by model manager 416. The objective function may be a summation of the energy consumption, energy cost, or other variable of interest over a given time period. The instantaneous energy consumption at a discrete time step is given by:

$$E = \eta_{coil}\rho\overline{f}(c\Delta T_c + L\Delta\omega_c) + \eta_{fan}\overline{f}\Delta P + \eta_{UV}\lambda_{UV}$$

which can be summed or integrated over all time steps of the given time period as follows:

$$\int_0^T E(t)dt \approx \Delta \sum_t E_t$$

where $\Delta$ is the duration of a discrete time step, according to some embodiments.

Process 600 includes determining one or more constraints for the objective function including an infection probability constraint (step 614), according to some embodiments. In some embodiments, step 614 is performed by constraint generator 410. The one or more constraints can include the infection probability constraint, temperature bounds or constraints, humidity bounds or constraints, fresh-air ventilation bounds or constraints, VAV flow bounds or constraints, and/or outdoor-air damper bounds or constraints. The infection probability constraint is:

$$M\eta + \sum_t \mu_t \leq -\frac{1}{p\Delta} \log(1 - P^{max})$$

$$\mu_t + \eta \geq N_t \ \forall \ t$$

or:

$$N_t \leq N_t^{max} = -\frac{1}{Mp\Delta} \log(1 - P^{max})$$

according to some embodiments.

Process 600 includes performing an optimization to determine control decisions for HVAC equipment of the HVAC system, and ultraviolet lights of the HVAC system such that the one or more constraints are met and the cost is minimized (step 616), according to some embodiments. Step 616 can be performed by optimization manager 412 by minimizing the objective function subject to the one or more constraints (e.g., the temperature, humidity, etc., bounds and the infection probability constraint). Step 616 can also include constructing the optimization problem and constructing the optimization problem based on the objective function, the dynamic models (or the aggregated dynamic models), and the one or more constraints. The control decisions can include a fresh-air fraction x for an AHU of the HVAC system (e.g., AHU 304), whether to turn on or off the UV lights, etc.

Off-Line Optimization Process

Figure 7:
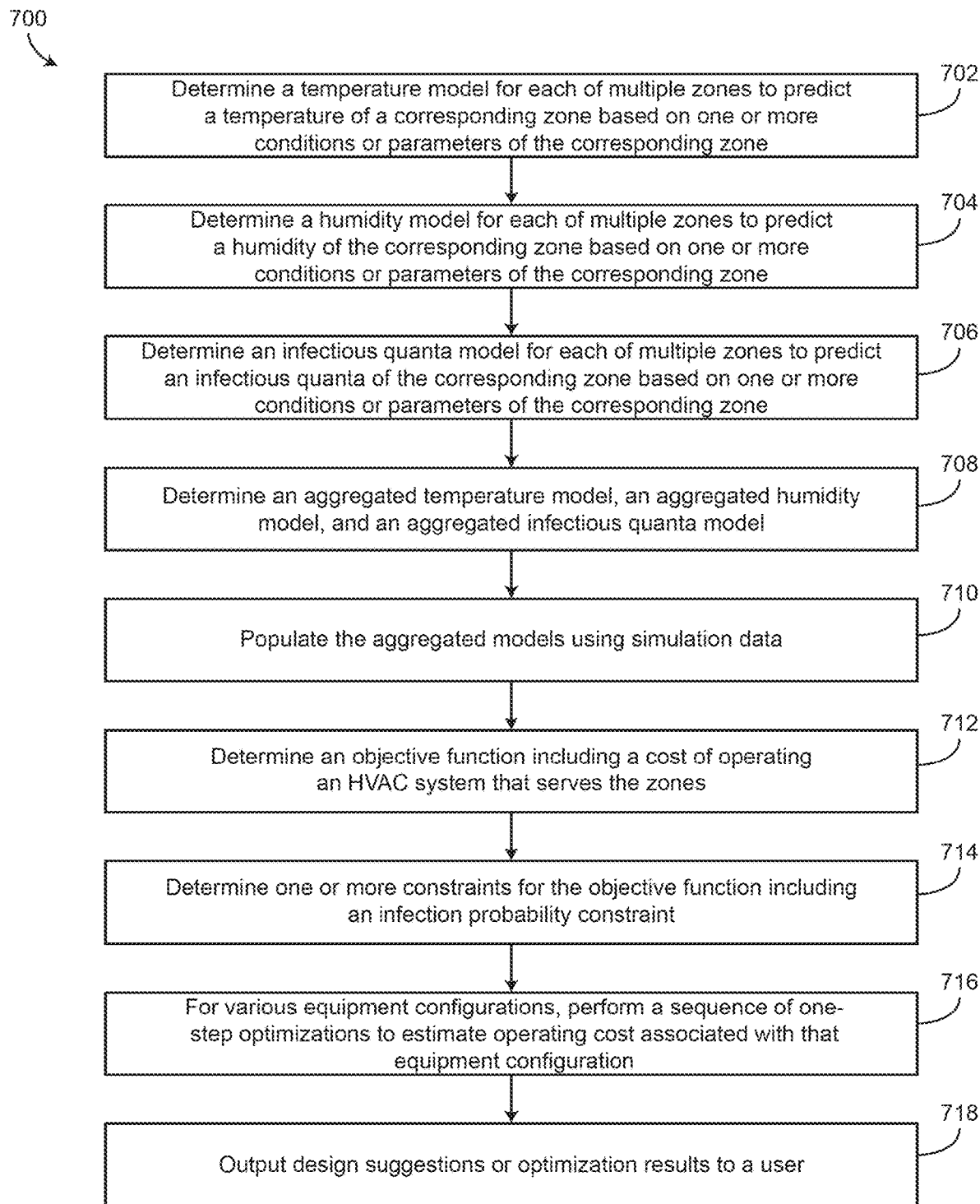
FIG. 7 is a flow diagram of a process which can be performed by the controller of FIG. 3 for determining design suggestions for an HVAC system to minimize energy consumption and provide sufficient disinfection, according to some embodiments.

Referring particularly to FIG. 7, a process for performing an off-line optimization to determine equipment configurations that minimize energy consumption or cost and satisfy an infection probability constraint is shown, according to some embodiments. Process 700 may share similarities with process 600 but can be performed in an off-line mode (e.g., without determining control decisions or based on real-time sensor data) to determine or assess various design decisions and provide design information to a building manager. Process 700 can be performed by controller 310 when configured for the off-line mode (as shown in FIG. 5).

Process 700 includes steps 702-708 that can be the same as steps 602-608 of process 600. However, while step 608 may be optional in process 600 so that the optimization can be performed using a combination of individual dynamic models and aggregate dynamic models, step 708 may be non-optional in process 700. In some embodiments, using the aggregate dynamic models reduces a computational complexity of the optimization for process 700. Process 700 can be performed for a wide variety of design parameters (e.g., different equipment configurations) whereas process 600 can be performed for a single equipment configuration (e.g., the equipment configuration that process 600 is used to optimize). Therefore, it can be advantageous to use aggregate models in process 700 to reduce a complexity of the optimization problem.

Process 700 includes populating the aggregated models using simulation data (step 710). In some embodiments, step 710 is performed by model manager 416 using outputs from simulation database 424 (e.g., using values of various parameters of the aggregate models that are stored in simulation database 424). In some embodiments, step 710 is performed using known, assumed, or predetermined values to populate the aggregated models.

Process 700 includes determining an objective function including a cost of operating an HVAC system that serves the zones (step 712), and determining one or more constraints for the objective function including an infection probability constraint (step 714), according to some embodiments. In some embodiments, step 712 and step 714 are similar to or the same as steps 612 and 614 of process 600.

Process 700 includes performing a sequence of one-step optimizations for various equipment configurations to estimate an operating cost associated with that equipment configuration (step 716), according to some embodiments. In some embodiments, step 716 is performed by optimization manager 412. Optimization manager 412 can construct different optimization problems for different equipment configurations using the aggregate temperature model, the aggregated humidity model, the aggregated infectious quanta model, the one or more constraints, and the objective function. In some embodiments, optimization manager 412 is configured to solve the optimization problems for the different equipment configurations over a single time step. The results of the optimizations problems can be output to results manager 418 for displaying to a user.

Process 700 includes outputting design suggestions or optimizations results to a user (step 718), according to some embodiments. In some embodiments, step 718 includes outputting costs associated with different equipment configurations (e.g., equipment configurations that include UV lights for disinfection and/or filters for disinfection) to a user (e.g., via a display device) so that the user (e.g., a building manager) can determine if they wish to purchase additional disinfection equipment (e.g., UV lights and/or filters). For example, step 718 can include operating a display to provide graph 800 (or a similar graph) to a user.

Although process 700 is described primarily as an "off-line" process, it should be understood that process 700 is not limited to off-line implementations only. In some embodiments, process 700 can be used when controller 310 operates in an on-line mode (as described with reference to FIGS. 4 and 6). In some embodiments, the results generated by performing process 700 and/or the results generated when operating controller 310 in the off-line mode (e.g., recommended equipment configurations, recommended operating parameters, etc.) can be used to perform on-line control of HVAC equipment or perform other automated actions. For example, controller 310 can use the recommended equipment configurations to automatically enable, disable, or alter the operation of HVAC equipment in accordance with the recommended equipment configurations (e.g., enabling the set of HVAC equipment associated with the lowest cost equipment configuration identified by the simulations/optimizations). Similarly, controller 310 can use the recommended operating parameters to generate and provide control signals to the HVAC equipment (e.g., operating the HVAC equipment in accordance with the recommended operating parameters).

In general, the controller 310 can use the optimization/simulation results generated when operating controller 310 in the off-line mode to generate design data including one or more recommended design parameters (e.g., whether to include or use UV lights 306 for disinfection, whether to include or use filter 308 for disinfection, whether to use fresh/outdoor air for disinfection, a recommended type or rating of UV lights 306 or filter 308, etc.) as well as operational data including one or more recommended operational parameters (e.g., the fraction of fresh/outdoor air that should exist in the supply air provided to the building zone, operating decisions for UV lights 306, an amount of airflow to send to each building zone, etc.). The design data may include a recommended equipment configuration that specifies which HVAC equipment to use in the HVAC system to optimize the energy consumption, energy cost, carbon footprint, or other variable of interest while ensuring that a desired level of disinfection is provided.

Controller 310 can perform or initiate one or more automated actions using the design data and/or the operational data. In some embodiments, the automated actions include automated control actions such as generating and providing control signals to UV lights 306, AHU 304, one or more VAV units, or other types of airside HVAC equipment that operate to provide airflow to one or more building zones. In some embodiments, the automated action include initiating a process to purchase or install the recommended set of HVAC equipment defined by the design data (e.g., providing information about the recommended set of HVAC equipment to a user, automatically scheduling equipment upgrades, etc.). In some embodiments, the automated actions include providing the design data and/or the operational data to a user interface device (e.g., display device 422) and/or obtaining user input provided via the user interface device. The user input may indicate a desired level of disinfection and/or a request to automatically update the results of the optimizations/simulations based on user-selected values that define the desired infection probability or level of disinfection. Controller 310 can be configured to provide any of a variety of user interfaces (examples of which are discussed below) to allow a user to interact with the results of the optimizations/simulations and adjust the operation or design of the HVAC system based on the results.

User Interfaces

Figure 9:
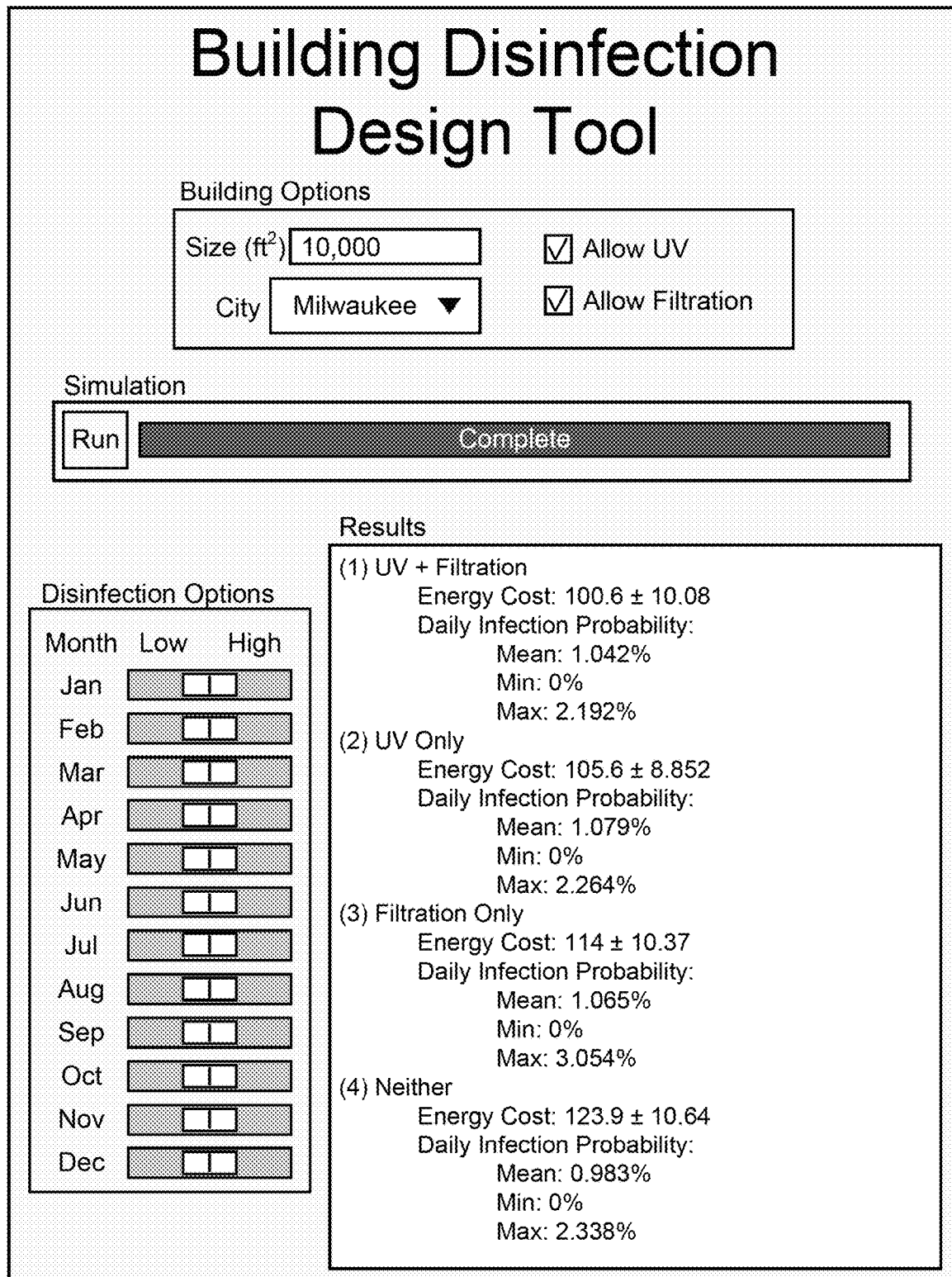
FIG. 9 is a drawing of a user interface that can be used to specify building options and disinfection options and provide simulation results, according to some embodiments.

Referring now to FIGS. 5 and 9, in some embodiments, user input device 420 is configured to provide a user interface 900 to a user. An example of a user interface 900 that can be generated and presented via user input device 420 is shown in FIG. 9. User interface 900 may allow a user to provide one or more user inputs that define which equipment are available in the building or should be considered for design purposes (e.g., filtration, UV, etc.) as well as the desired infection probability (e.g., low, medium, high, percentages, etc.). The inputs provided via user interface 900 can be used by controller 310 to set up the optimization problem or problems to be solved by optimization manager 412. For example, constraint generator 410 can use the inputs received via user interface 900 to generate the various bounds, boundaries, constraints, infection probability constraint, etc., that are used by optimization manager 412 to perform the optimization. After completing all of the simulation scenarios, the results can be presented to the user via the "Results" portion of user interface 900 that allows the user to explore various tradeoffs.

As an example, the "Building Options" portion of user interface 900 allows the user to specify desired building and climate parameters such as the square footage of the building, the city in which the building is located, etc. The user may also specify whether UV disinfection and/or advanced filtration should be considered in the simulation scenarios (e.g., by selecting or deselecting the UV and filtration options). The "Disinfection Options" portion of user interface 900 allows the user to specify the desired level of disinfection or infection probability. For example, the user can move the sliders within the Disinfection Options portion of user interface 900 to define the desired level of disinfection for each month (e.g., low, high, an intermediate level, etc.). Alternatively, user interface 900 may allow the user to define the desired level of disinfection by inputting infection probability percentages, via a drop-down menu, by selecting or deselecting checkboxes, or any other user interface element.

After specifying the desired parameters and clicking the "Run" button, optimization manager 412 may perform one or more simulations (e.g., by solving one or more optimization problems) using the specified parameters. Once the simulations have completed, results may be displayed in the "Results" portion of user interface 900. The results may indicate the energy cost, energy consumption, carbon footprint, or any other metric which optimization manager 412 seeks to optimize for each of the design scenarios selected by the user (e.g., UV+Filtration, UV Only, Filtration Only, Neither). The results may also indicate the daily infection probability for each of the design scenarios (e.g., mean infection probability, minimum infection probability, maximum infection probability). In some embodiments, an initial simulation or simulations are run using default settings for the disinfection options. In some embodiments, the results include equipment recommendations (e.g., use UV+Filtration, use UV Only, use Filtration Only, use Neither). The results of each simulation can be sorted to present the most optimal results first and the least optimal results last. For example, user interface 900 is shown presenting the simulation result with the least energy consumption first and the most energy consumption last. In other embodiments, the results can be sorted by other criteria such as infection probability or any other factor.

The user can adjust desired disinfection options on a monthly basis (e.g., by adjusting the sliders within the Disinfection Options portion of user interface 900), at which point the results may be re-calculated by averaging over the appropriate subset of simulation instances, which can be performed in real time because the simulations need not repeated. Advantageously, this allows the user to adjust the disinfection options and easily see the impact on energy cost, energy consumption, carbon footprint, etc., as well as the impact on infection probability for each of the design scenarios. Additional display options beyond what is shown in FIG. 9 may be present in various embodiments, for example to selectively disable UV and/or filtration in certain months or to consider worst-case instances for each month rather than mean values. In addition, various other graphical displays could be added to provide more detailed results. User interface 900 may initially present optimization results and/or equipment recommendations based on default settings, but then the user is free to refine those settings and immediately see updates to cost estimates and suggested equipment.

Although a specific embodiment of user interface 900 is shown in FIG. 9, it should be understood that this example is merely one possible user interface that can be used in combination with the systems and methods described herein. In general, controller 310 can operate user input device 420 to provide a user interface that includes various sliders, input fields, etc., to receive a variety of user inputs from the user via user input device 420. In some embodiments, user input device 420 is configured to receive a desired level of disinfection, a desired level of infection probability, etc., from the user and provide the desired level of disinfection, or desired level of infection probability to constraint generator 410 as the user input(s). In some embodiments, the user interface includes a knob or a slider that allows the user to adjust between a level of energy savings and a level of infection control. For example, the user may adjust the knob or slider on the user input device 420 to adjust the infection probability constraint (e.g., to adjust thresholds or boundaries associated with the infection probability constraint).

In some embodiments, an infection spread probability is treated by constraint generator 410 as a constraint, or as a value that is used by constraint generator 410 to determine the infection probability constraint. If a user desires to provide a higher level of disinfection (e.g., a lower level of infection spread probability) and therefore an increased energy consumption or energy consumption cost, the user may adjust the knob or slider on the user interface of user input device 420 to indicate a desired trade-off between energy consumption and infection probability. Likewise, if the user desired to provide a lower level of disinfection (e.g., a higher level of infection spread probability) and therefore a lower energy consumption or energy consumption cost, the user may adjust the knob or slider on the user interface of the user input device 420 to indicate such a desired tradeoff between energy consumption or energy consumption cost and disinfection control.

In some embodiments, user input device 420 is configured to provide analytics, data, display data, building data, operational data, diagnostics data, energy consumption data, simulation results, estimated energy consumption, or estimated energy consumption cost to the user via the user interface of user input device 420. For example, results manager 418 may operate the user input device 420 and/or the display device 422 to provide an estimated energy consumption or energy consumption cost to the user (e.g., results of the optimization of optimization manager 412 when operating in either the on-line or off-line mode/configuration). In some embodiments, user input device 420 and display device 422 are a same device (e.g., a touchscreen display device, etc.) that are configured to provide the user interface, while in other embodiments, user input device 420 and display device 422 are separate devices that are configured to each provide their own respective user interfaces.

For example, controller 310 can perform the off-line or planning or design tool functionality as described in greater detail above in real-time (e.g., as the user adjusts the knob or slider) to determine an estimated energy consumption or energy consumption cost given a particular position of the knob or slider (e.g., given a particular desired level of infection or disinfection control as indicated by the position of the knob or slider). In some embodiments, controller 310 is configured to operate the user input device 420 and/or the display device 422 to provide or display the estimated energy consumption or estimated energy consumption cost as the user adjusts the knob or slider. In this way, the user can be informed regarding an estimation of costs or energy consumption associated with a specific level of disinfection control (e.g., with a particular infection probability constraint). Advantageously, providing the estimation of costs or energy consumption associated with the specific level of disinfection control to the user in real-time or near real-time facilitates the user selecting a level of disinfection control that provides sufficient or desired disinfection control in addition to desired energy consumption or energy consumption costs.

Pareto Optimization

Figure 10:
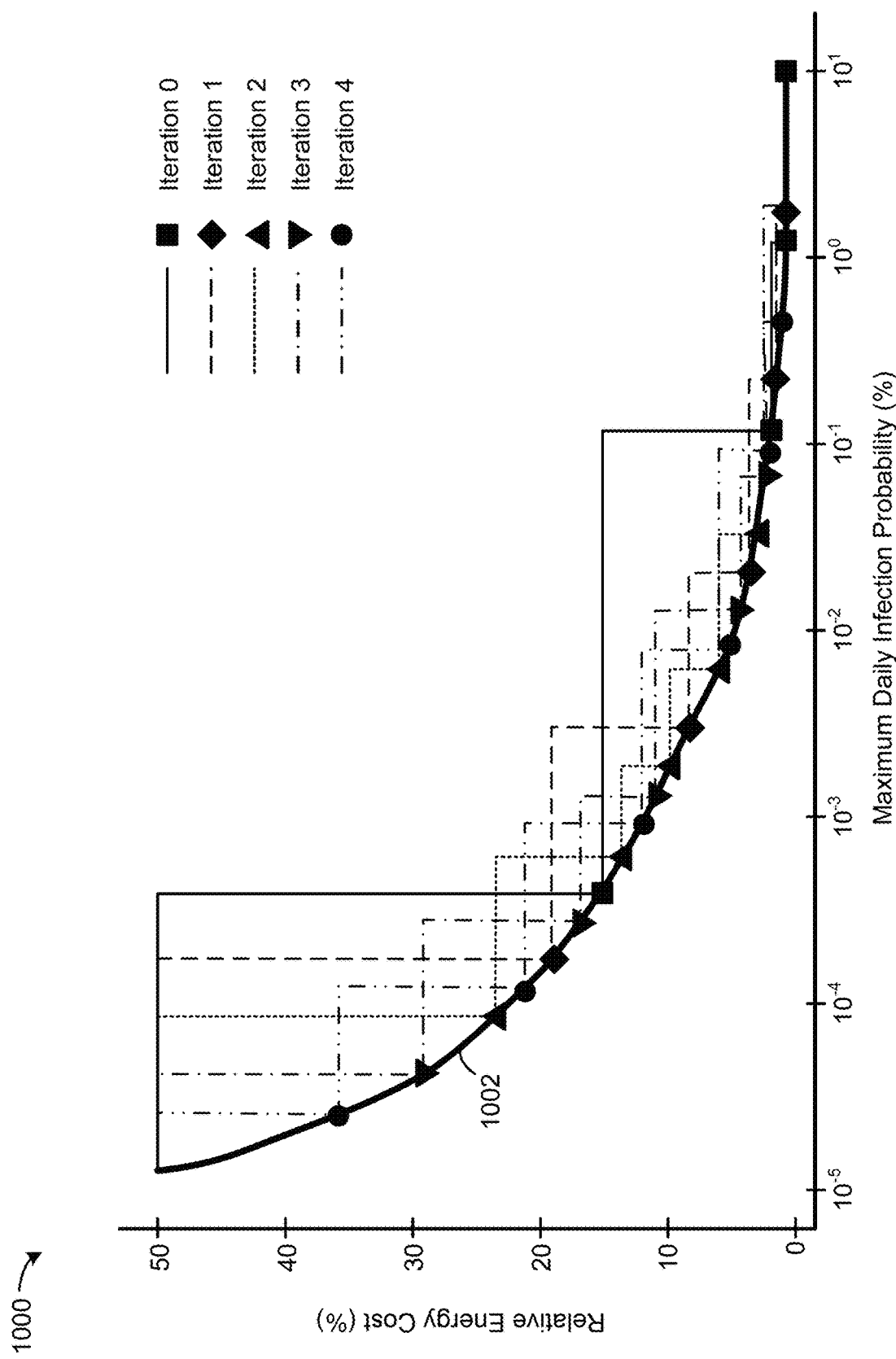
FIG. 10 is a graph illustrating a technique which can be used by the controller of FIG. 3 to estimate a Pareto front of a tradeoff curve for relative energy cost vs. infection probability, according to some embodiments.

Referring now to FIG. 10, a graph 1000 illustrating a Pareto search technique which can be used by controller 310 is shown, according to an exemplary embodiment. In some cases, users may want a more detailed tradeoff analysis than merely comparing a set of optimization results for a set of selected infection probabilities. For such cases, controller 310 may use a more detailed Pareto search that iteratively determines points on a Pareto front 1002 for an energy cost vs. infection probability tradeoff curve. By running additional simulations, this tradeoff curve can be plotted as accurately as possible so that users can fully evaluate the entire continuum of infection probabilities, (e.g., to look for natural breakpoints where additional disinfection probability begins to get more expensive).

To determine the points on the Pareto front 1002, controller 310 may start with a small number of infection probabilities already simulated for a given month and plot them against monthly energy cost. Then, additional candidate infection probabilities can be selected (e.g., as the points furthest from already completed simulations). After simulating instances with the new infection probabilities, these points are added to the plot, and the process repeats to the desired accuracy. Many criteria for selecting new points are possible, but one possible strategy is to choose the midpoint of successive points with the largest area (i.e., of the rectangle whose opposite corners are given by the two existing points) between them. This strategy prioritizes regions where the curve is changing rapidly and leads to efficient convergence.

As an example, consider the case in graph 1000. The goal is to obtain an approximation of the true Pareto front 1002, which is illustrated in FIG. 10 for ease of explanation, but may not be truly known. The instances of the optimization run for the small number of infection probabilities result in the points marked with squares in graph 1000 for Iteration 0. This gives a very coarse approximation of the true front. Controller 310 may then select new points in each iteration, run those simulations, and add those points to graph 1000. For example, the points marked with diamond shapes in graph 1000 show the points selected for Iteration 1 the points marked with triangles in graph 1000 show the points selected for Iteration 2, the points marked with inverted triangles in graph 1000 show the points selected for Iteration 3, and the points marked with circles in graph 1000 show the points selected for Iteration 4. By the end of Iteration 4, the empirical Pareto front is a good approximation of the true front 1002, and of course additional iterations can be performed to further improve accuracy. The empirical Pareto front generated using this technique can be used by controller 300 to solve a Pareto optimization problem to determine an optimal tradeoff between the costs and benefits of selecting different infection probability values in the infection probability constraint.

In some embodiments, determining the infection probability constraint (e.g., to provide an optimal level of disinfection control, or an optimal level of infection probability spread) and the resulting energy consumption or energy consumption costs required for HVAC system 200 to operate to achieve the infection probability constraint is a Pareto optimization problem. For example, at a certain point, additional disinfection control may require undesirably high energy consumption or energy consumption costs. In some embodiments, controller 310 may solve a Pareto optimization problem given various inputs for the system to determine one or more inflection points along a curve between cost (e.g., energy consumption or energy consumption cost) and a benefit (e.g., disinfection control, infection probability, disinfection, etc.) or to determine an optimal tradeoff between the cost and the benefit.

In some embodiments, controller 310 is configured to operate display device 422 and/or user input device 420 to provide an infection probability constraint associated with the optimal tradeoff between the cost and the benefit. In some embodiments, controller 310 can operate according to various modes that can be selected by the user via the user interface of user input device 420. For example, the user may opt for a first mode where controller 310 solves the Pareto optimization problem to determine the infection probability constraint associated with the optimal tradeoff point between the cost (e.g., the energy consumption or energy consumption cost) and the benefit (e.g., the disinfection control, a provided level of disinfection, an infection probability, etc.). In the first mode, the controller 310 can automatically determine the infection probability constraint based on the results of the Pareto optimization problem. In some embodiments, controller 310 still operates display device 422 to provide estimated, actual, or current energy consumption or energy consumption costs and infection probability constraints.

In a second mode, controller 310 can provide the user the ability to manually adjust the tradeoff between the cost and the benefit (e.g., by adjusting the slider or knob as described in greater detail above). In some embodiments, the user may select the desired tradeoff between infection control and energy consumption or energy consumption costs based on the provided estimations of energy consumption or energy consumption costs.

In a third mode, controller 310 can provide the user additional manual abilities to adjust the infection probability constraint directly. In this way, the user may specifically select various boundaries (e.g., linear boundaries if the infection probability constraint is implemented as a linear constraint as described in greater detail above) for the infection probability constraint. In some embodiments, the user may select between the various modes (e.g., the first mode, the second mode, and/or the third mode).

It should be understood that while the Pareto optimization as described herein is described with reference to only two variables (e.g., energy consumption or energy consumption cost and disinfection control), the Pareto optimization may also account for various comfort parameters or variables (e.g., temperature and/or humidity of zones 206, either individually or aggregated). In some embodiments, controller 310 may also operate display device 422 to provide various comfort parameters that result from a particular position of the knob or slider that is provided on the user interface of user input device 420. In some embodiments, additional knobs, sliders, input fields, etc., are also provided on the user interface of user input device 420 to receive various inputs or adjustments for desired comfort parameters (e.g., temperature and/or humidity). In some embodiments, controller 310 (e.g., results manager 418) is configured to use the dynamic models for temperature or humidity as described above to determine estimations of the various comfort parameters as the user adjusts the knobs or sliders (e.g., the knobs or sliders associated with disinfection control and/or energy consumption or energy cost consumption). Similarly, controller 310 can solve the Pareto optimization problem as a multi-variable optimization problem to determine an inflection point or a Pareto efficiency on a surface (e.g., a 3d graph or a multi-variable optimization) which provides an optimal tradeoff between cost (e.g., the energy consumption, the energy consumption cost, etc.), comfort (e.g., temperature and/or humidity), and disinfection control (e.g., the infection probability constraint).

CONFIGURATION OF EXEMPLARY EMBODIMENTS

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, calculation steps, processing steps, comparison steps, and decision steps.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

As used herein, the term "circuit" may include hardware structured to execute the functions described herein. In some embodiments, each respective "circuit" may include machine-readable media for configuring the hardware to execute the functions described herein. The circuit may be embodied as one or more circuitry components including, but not limited to, processing circuitry, network interfaces, peripheral devices, input devices, output devices, sensors, etc. In some embodiments, a circuit may take the form of one or more analog circuits, electronic circuits (e.g., integrated circuits (IC), discrete circuits, system on a chip (SOCs) circuits, etc.), telecommunication circuits, hybrid circuits, and any other type of "circuit." In this regard, the "circuit" may include any type of component for accomplishing or facilitating achievement of the operations described herein. For example, a circuit as described herein may include one or more transistors, logic gates (e.g., NAND, AND, NOR, OR, XOR, NOT, XNOR, etc.), resistors, multiplexers, registers, capacitors, inductors, diodes, wiring, and so on).

The "circuit" may also include one or more processors communicably coupled to one or more memory or memory devices. In this regard, the one or more processors may execute instructions stored in the memory or may execute instructions otherwise accessible to the one or more processors. In some embodiments, the one or more processors may be embodied in various ways. The one or more processors may be constructed in a manner sufficient to perform at least the operations described herein. In some embodiments, the one or more processors may be shared by multiple circuits (e.g., circuit A and circuit B may comprise or otherwise share the same processor which, in some example embodiments, may execute instructions stored, or otherwise accessed, via different areas of memory). Alternatively or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. Each processor may be implemented as one or more general-purpose processors, application specific integrated circuits (ASICs), field programmable gate arrays (FPGAs), digital signal processors (DSPs), or other suitable electronic data processing components structured to execute instructions provided by memory. The one or more processors may take the form of a single core processor, multi-core processor (e.g., a dual core processor, triple core processor, quad core processor, etc.), microprocessor, etc. In some embodiments, the one or more processors may be external to the apparatus, for example the one or more processors may be a remote processor (e.g., a cloud based processor). Alternatively or additionally, the one or more processors may be internal and/or local to the apparatus. In this regard, a given circuit or components thereof may be disposed locally (e.g., as part of a local server, a local computing system, etc.) or remotely (e.g., as part of a remote server such as a cloud based server). To that end, a "circuit" as described herein may include components that are distributed across one or more locations.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

What is claimed is:

1. A heating, ventilation, or air conditioning (HVAC) system design and operational tool for a HVAC system for a building, the HVAC design and operational tool comprising:
    one or more processors; and
    memory storing instructions that, when executed by the one or more processors, cause the one or more processors to perform operations comprising:
        obtaining a dynamic temperature model and a dynamic infectious quanta model for one or more building zones;
        determining a relationship between infection probability and infectious quanta defined by the dynamic infectious quanta model;
        performing a plurality of simulations for a plurality of different equipment configurations using the dynamic temperature model, the dynamic infectious quanta model, and the relationship between the infection probability and the infectious quanta to generate results;
        generating, using the results of the plurality of simulations, at least one of design data comprising one or more recommended design parameters or operational data comprising one or more recommended operational parameters for the HVAC system; and
        initiating an automated action comprising at least one of an automated configuration activity or presenting at least one of the recommended design parameters or the recommended operational parameters using at least one of the design data or the operational data.

2. The HVAC design and operational tool of claim 1, wherein the operations further comprise:
    determining a dynamic humidity model for the one or more building zones; and
    performing the plurality of simulations using the dynamic humidity model to generate the results.

3. The HVAC design and operational tool of claim 1, wherein the one or more recommended design parameters indicate whether to include disinfection lighting for disinfection in the HVAC system, whether to include an air filter for disinfection in the HVAC system, and whether to use fresh air for disinfection in the HVAC system.

4. The HVAC design and operational tool of claim 1, wherein the one or more recommended design parameters comprise a recommended rating of an air filter for use in the HVAC system.

5. The HVAC design and operational tool of claim 1, wherein the automated action comprises presenting at least one of the design data or the operational data to a user via a user interface.

6. The HVAC design and operational tool of claim 1, wherein the plurality of simulations comprise at least two of:
    a first simulation in which the HVAC system includes disinfection lighting but does not include an air filter for disinfection;
    a second simulation in which the HVAC system includes the air filter but does not include the disinfection lighting for disinfection;
    a third simulation in which the HVAC system includes both the disinfection lighting and the air filter for disinfection; and
    a fourth simulation in which the HVAC system includes neither of the disinfection lighting nor the air filter for disinfection.

7. The HVAC design and operational tool of claim 1, wherein the operations further comprise:
    generating an infectious quanta constraint based on a user input indicating a desired a level of disinfection;
    performing at least one of the plurality of simulations subject to the infectious quanta constraint to generate an estimated cost of operating the HVAC system; and
    presenting the estimated cost of operating the HVAC system via a user interface.

8. The HVAC design and operational tool of claim 1, wherein the operations further comprise using the results of the plurality of simulations to provide a user interface that indicates a tradeoff between the infection probability and at least one of energy cost or energy consumption.

9. The HVAC design and operational tool of claim 1, wherein the recommended operational parameters comprise a recommended control scheme for the HVAC system.

10. The HVAC design and operational tool of claim 1, wherein the infectious quanta in the relationship is an infectious quanta concentration.

11. A heating, ventilation, or air conditioning (HVAC) design and operational tool for a HVAC system for a building, the HVAC design and operational tool comprising:
    one or more processors; and
    memory storing instructions that, when executed by the one or more processors, cause
    the one or more processors to perform operations comprising:
        obtaining a dynamic temperature model and a dynamic infectious quanta model for one or more building zones;
        determining a relationship between infection probability and infectious quanta defined by the dynamic infectious quanta model;
        performing a simulation using the dynamic temperature model, the dynamic infectious quanta model, and the relationship between the infection probability and the infectious quanta to generate results comprising a recommended equipment configuration of the HVAC system; and
        initiating an automated action comprising at least one of an automated configuration activity or presenting the recommended equipment configuration using the results.

12. The HVAC design and operational tool of claim 11, wherein the operations further comprise:
obtaining a dynamic humidity model for the one or more building zones; and
performing the simulation using the dynamic humidity model to generate the results.

13. The HVAC design and operational tool of claim 11, wherein the recommended equipment configuration indicates whether the HVAC system includes disinfection lighting for disinfection, whether the HVAC system includes a filter for disinfection, and whether the HVAC system uses fresh air for disinfection.

14. The HVAC design and operational tool of claim 11, wherein the results comprise recommended equipment specifications indicating at least one of a recommended rating of an air filter or a recommended rating of disinfection lighting for disinfection.

15. The HVAC design and operational tool of claim 11, wherein the automated action comprises presenting the results via a user interface.

16. The HVAC design and operational tool of claim 11, wherein performing the simulation comprises optimizing an objective function indicating a cost of operating the HVAC system using one or more potential equipment configurations to provide a desired level of disinfection.

17. The HVAC design and operational tool of claim 16, wherein the desired level of disinfection is a user-selected value.

18. The HVAC design and operational tool of claim 11, wherein the operations further comprise:
generating an infectious quanta constraint based on a user input indicating a desired a level of disinfection;
performing the simulation subject to the infectious quanta constraint to generate an estimated cost of operating the HVAC system; and
presenting the estimated cost of operating the HVAC system via a user interface.

19. The HVAC design and operational tool of claim 18, wherein the user input indicates a tradeoff between the desired level of disinfection and energy cost, the energy cost comprising at least one of an estimated energy consumption of the HVAC system or an estimated monetary cost of the estimated energy consumption of the HVAC system.

20. A method for providing design and operating recommendations for a heating, ventilation, or air conditioning (HVAC) system to achieve a desired level of infection control in a building, the method comprising:
obtaining a dynamic temperature model and a dynamic infectious quanta model for one or more building zones;
determining a relationship between infection probability and infectious quanta defined by the dynamic infectious quanta model;
using the dynamic temperature model, the dynamic infectious quanta model, and the relationship between the infection probability and the infectious quanta to generate at least one of design recommendations or operating recommendations to achieve the desired level of infection control; and
operating a display to provide at least one of the design recommendations or the operating recommendations to a user, each of the design recommendations or the operating recommendations comprising an associated cost.

21. The method of claim 20, wherein the design recommendations or the operating recommendations comprise at least one of:
a recommended equipment configuration of the HVAC system;
recommended equipment specifications of the HVAC system;
a recommended filter rating of a filter of the HVAC system;
a recommended model of equipment of the HVAC system; or
a recommended control scheme for the HVAC system.

* * * * *